(12) United States Patent
Siegert et al.

(10) Patent No.: US 10,043,643 B2
(45) Date of Patent: Aug. 7, 2018

(54) END BLOCK ASSEMBLY, BEARING ASSEMBLY, AND METHOD FOR MANUFACTURING A BEARING ASSEMBLY

(71) Applicant: VON ARDENNE GmbH, Dresden (DE)

(72) Inventors: Sebastian Siegert, Dresden (DE); Gerit Stude, Dresden (DE); Gerd Arnold, Dresden (DE)

(73) Assignee: VON ARDENNE Asset GmbH & Co. KG, Dresden (DE)

( * ) Notice: Subject to any disclaimer, the term of this patent is extended or adjusted under 35 U.S.C. 154(b) by 46 days.

(21) Appl. No.: 15/150,483

(22) Filed: May 10, 2016

(65) Prior Publication Data

US 2016/0343550 A1    Nov. 24, 2016

(30) Foreign Application Priority Data

May 19, 2015  (DE) ......................... 10 2015 107 809

(51) Int. Cl.
*H01J 37/34* (2006.01)
*C23C 14/34* (2006.01)
(Continued)

(52) U.S. Cl.
CPC ...... *H01J 37/3435* (2013.01); *C23C 14/3407* (2013.01); *F16C 19/24* (2013.01);
(Continued)

(58) Field of Classification Search
CPC .. H01J 37/3435; H01J 37/342; H01J 37/3411; H01J 37/3405; C23C 14/3407; F16C 19/24
See application file for complete search history.

(56) References Cited

U.S. PATENT DOCUMENTS

2011/0147209 A1   6/2011  Teschner et al.
2013/0008777 A1*  1/2013  Choquette .......... H01J 37/3405
                                                204/192.12

FOREIGN PATENT DOCUMENTS

DE   102007049735 A1   5/2008
DE   102009056241 A1   6/2011
DE   102012200564 A1   7/2013

OTHER PUBLICATIONS

German Office Action based on application No. 10 2015 107 809.0 (5 pages + 2 pages of English translation) dated Feb. 3, 2016 (for reference purspose only).

(Continued)

*Primary Examiner* — Michael A Band
(74) *Attorney, Agent, or Firm* — Vieing, Jentschura & Partner MBB

(57) ABSTRACT

In various embodiments, an end block assembly for rotatably mounting a tubular electrode in a processing chamber is provided. The end block assembly includes a receptacle region for receiving a bearing assembly which has a coupling region for coupling the tubular electrode thereto, the bearing assembly of which the coupling region is supported by a sleeve of the bearing assembly. The sleeve is plug-fitted into the receptacle region. The sleeve is joined together from a plurality of segments, the external faces thereof forming a lateral surface of the bearing assembly and at least two segments thereof being formed from dissimilar materials. The external faces of the two segments are mutually aligned such that they are flush with one another.

15 Claims, 14 Drawing Sheets

(51) Int. Cl.
 *F16C 19/24* (2006.01)
 *H01J 25/50* (2006.01)
(52) U.S. Cl.
 CPC ......... *H01J 37/342* (2013.01); *H01J 37/3411* (2013.01); *H01J 25/50* (2013.01); *H01J 37/3405* (2013.01); *H01J 37/3417* (2013.01); *H01J 37/3444* (2013.01)

(56) References Cited

OTHER PUBLICATIONS

Belgian Search Report based on application No. 2016-05320 (9 pages) dated Dec. 21, 2016 (Reference Purpose Only).
"Engineering fit". In Wikipedia. Retrieved Nov. 27, 2017, from https://en.wikipedia.org/wiki/Engineering_fit.
David L. Goetsch et al., "Dimensioning and Notation", Technical Drawing (Drafting and Design), 2005, pp. 422-423 from chapter 10, 5th edition, Delmar Cengage Learning.
"ANSI Limits and Fits, ANSI Standards", retrieved Nov. 10, 2017, from http://www.cobanengineering.com/Tolerances/ANSILimitsAndFits.asp.

* cited by examiner

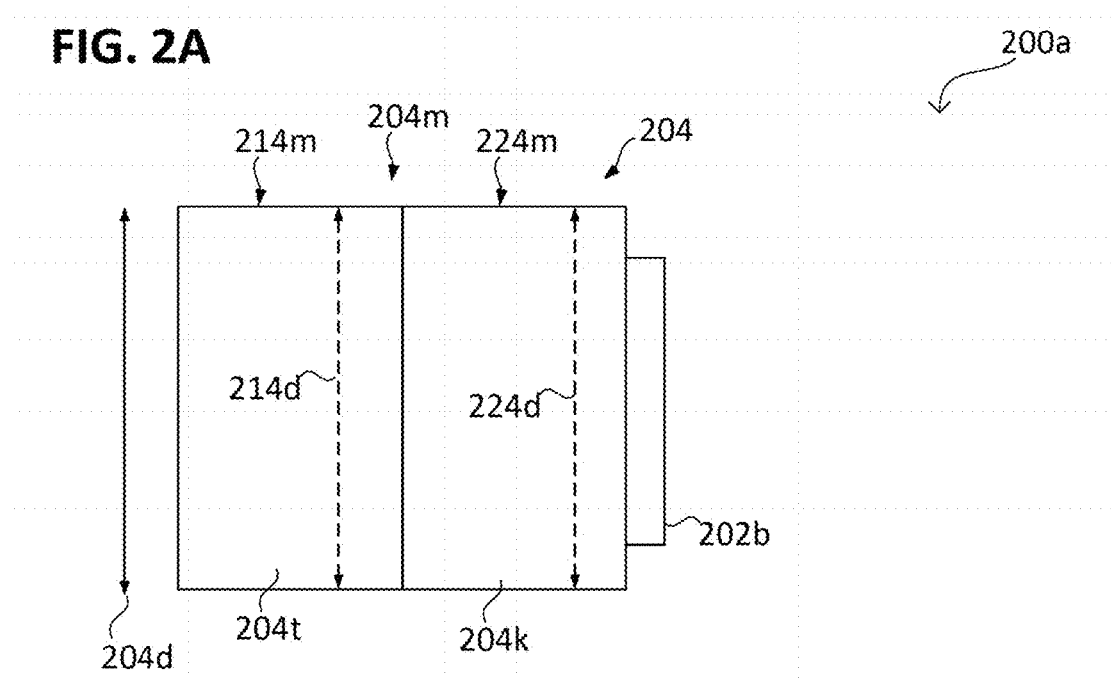
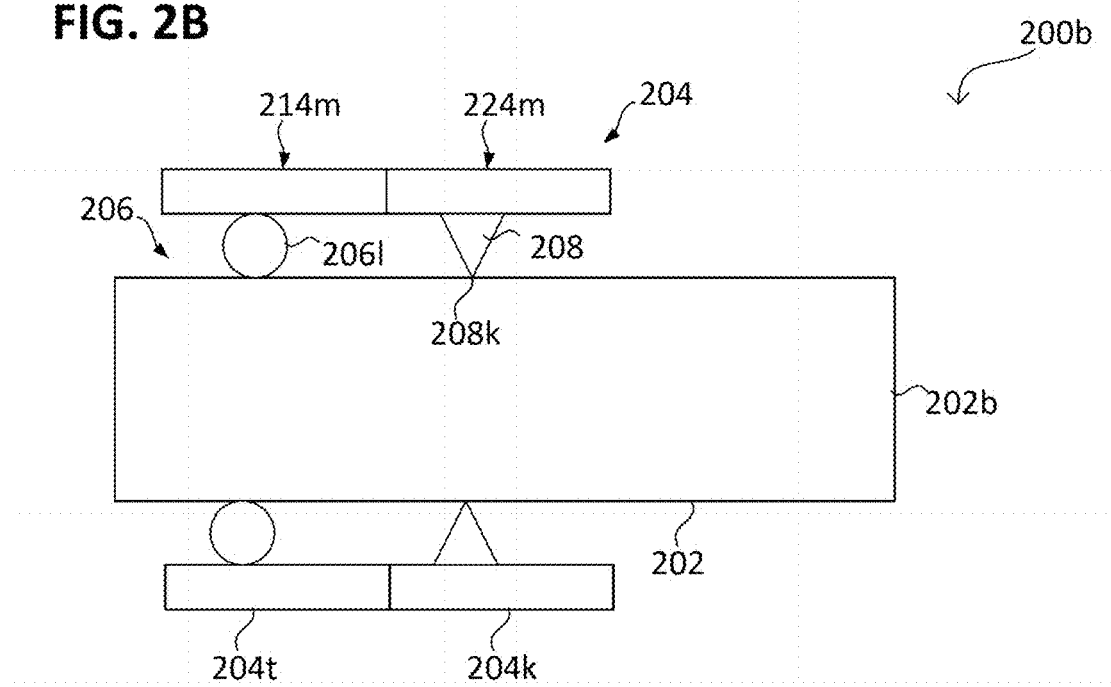

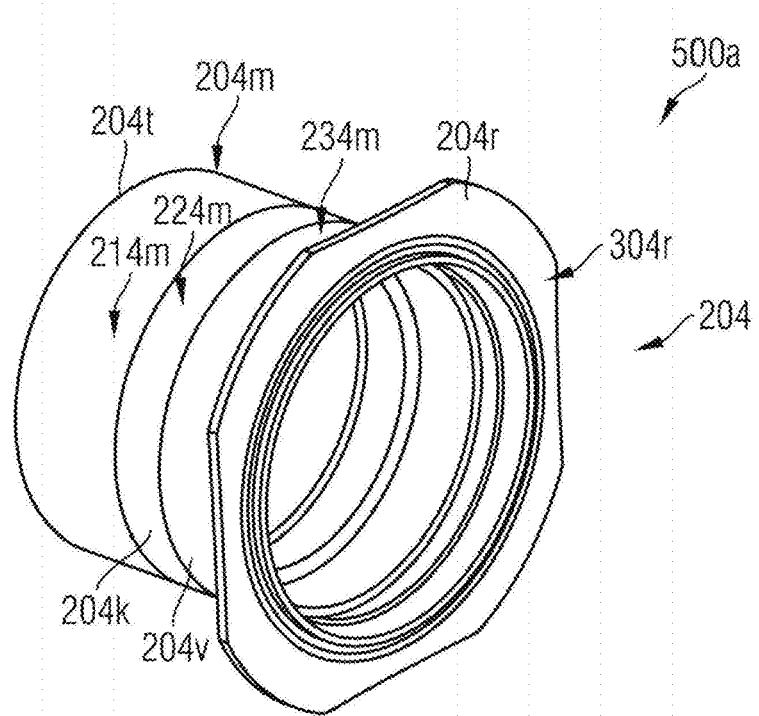
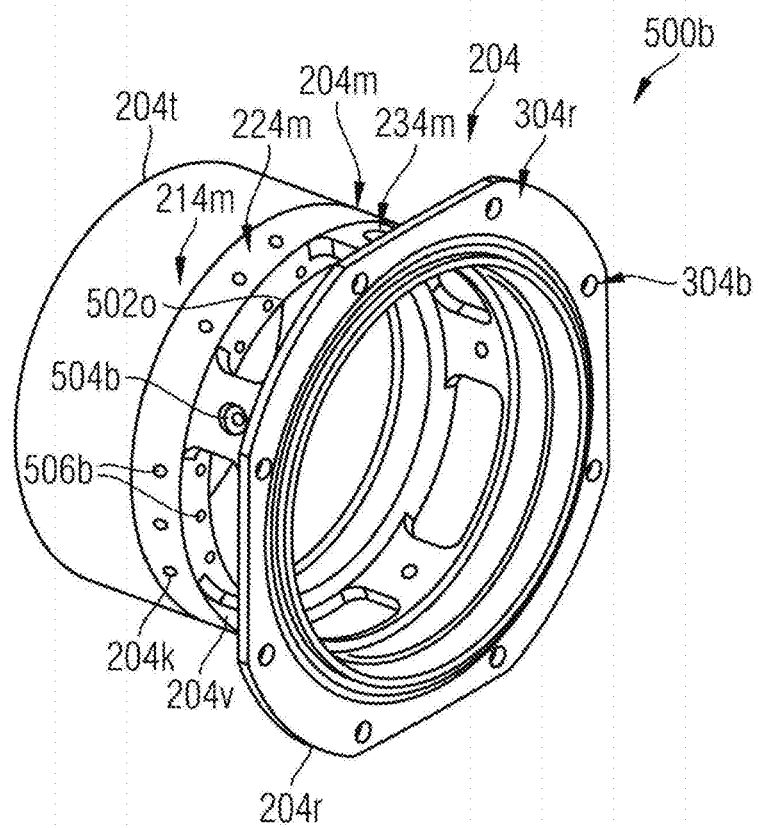

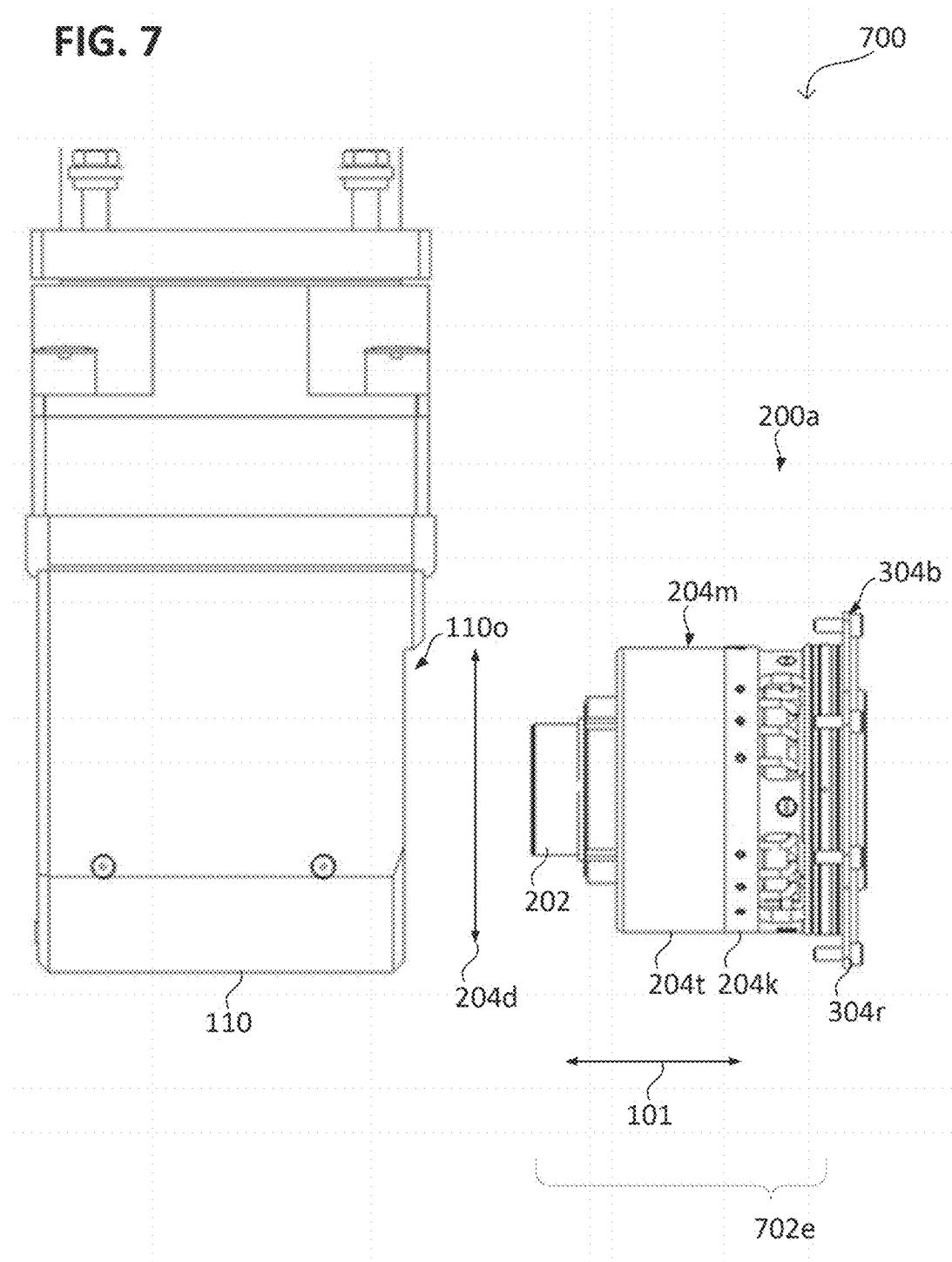

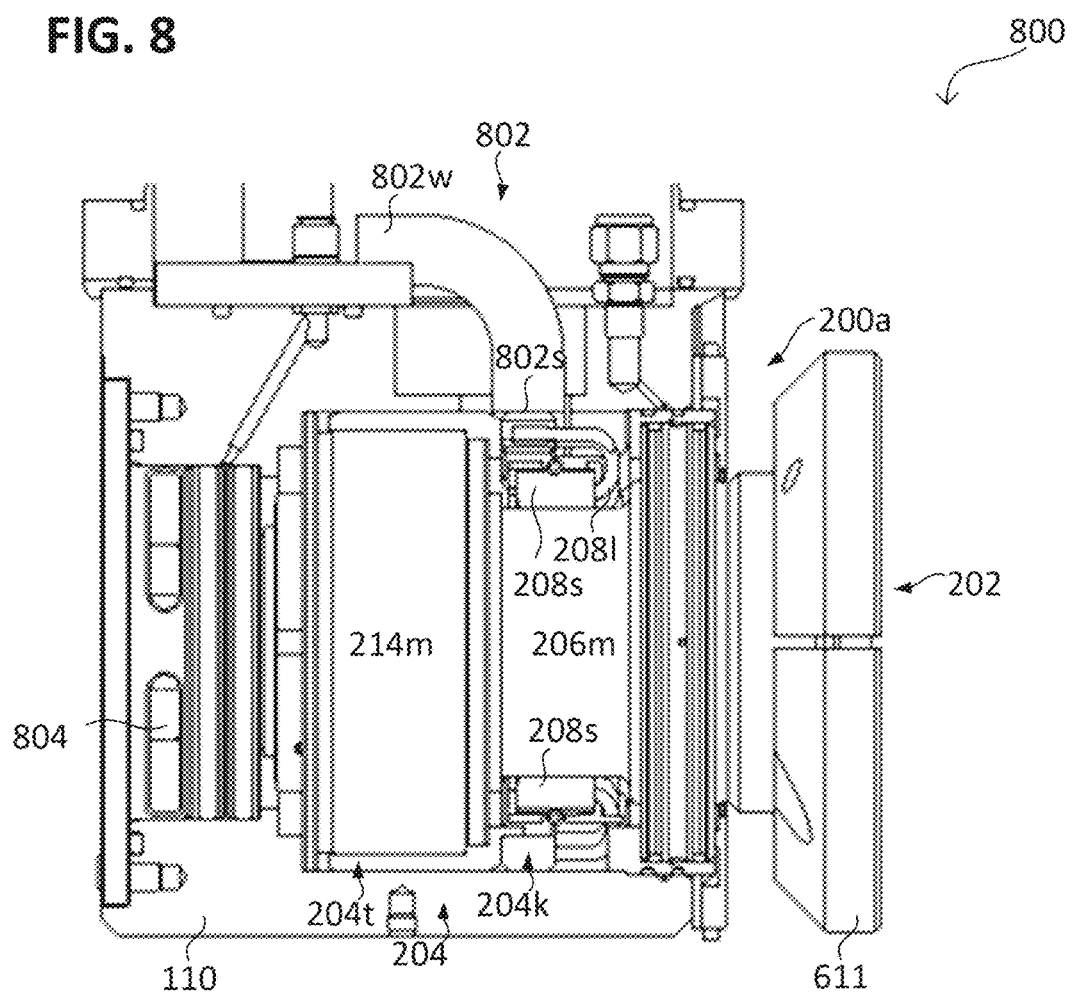

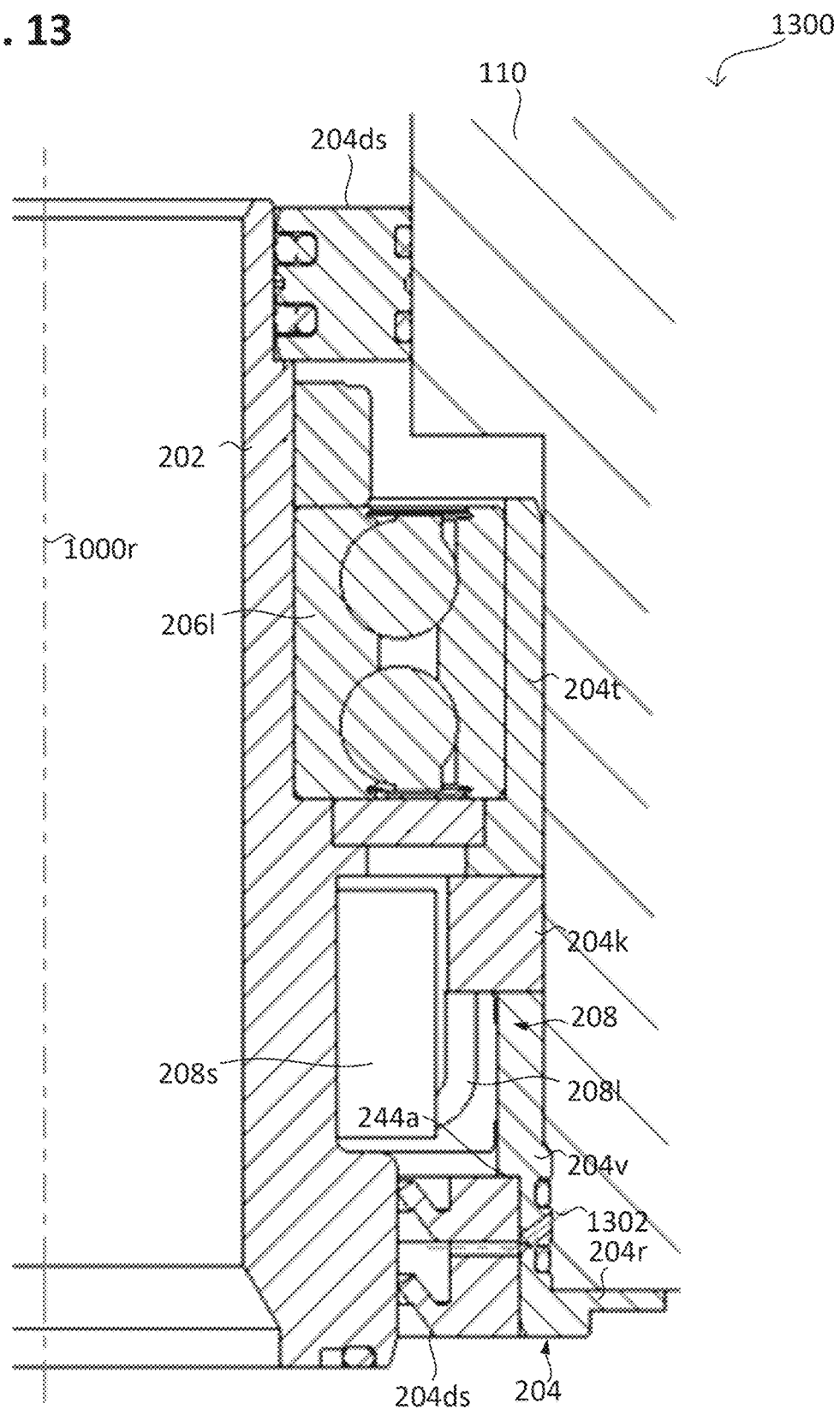

END BLOCK ASSEMBLY, BEARING
ASSEMBLY, AND METHOD FOR
MANUFACTURING A BEARING ASSEMBLY

CROSS-REFERENCE TO RELATED
APPLICATION

This application claims priority to German Patent Application Serial No. 10 2015 107 809.0, which was filed May 19, 2015, and is incorporated herein by reference in its entirety.

TECHNICAL FIELD

Various embodiments relate generally to an end block assembly, a bearing assembly, and a method for manufacturing a bearing assembly.

BACKGROUND

Electrodes may be employed in coating technology for various processes and/or pretreatments in general. For example, a tubular target (for example a cathode tube) from which the coating material may be sputtered, that is to say atomized, may be employed in a sputtering process (also referred to as cathode evaporation or sputter deposition). In general, a tubular electrode (cathode and/or anode, which may also be referred to as a cathode tube) may rotate during processing. This may enable a process which has long-term stability, for example, such as a coating process having long-term stability, for example. In the case of magnetron sputtering (magnetic-field-supported cathode evaporation) a cathode tube which rotates during the sputtering process may be utilized, for example, wherein a magnet assembly is disposed within the cathode tube in order to influence plasma formation and thus inter alia the sputtering rate and/or other process parameters of the sputtering process. Furthermore, a magnetron assembly may also have a plurality of cathode tubes (tubular targets), for example in the case of a so-called dual tubular magnetron (a so-called RDM, a rotatable dual magnetron).

SUMMARY

In various embodiments, an end block assembly for rotatably mounting a tubular electrode in a processing chamber is provided. The end block assembly includes a receptacle region for receiving a bearing assembly which has a coupling region for coupling the tubular electrode thereto, the bearing assembly of which the coupling region is supported by a sleeve of the bearing assembly. The sleeve is plug-fitted into the receptacle region. The sleeve is joined together from a plurality of segments, the external faces thereof forming a lateral surface of the bearing assembly and at least two segments thereof being formed from dissimilar materials. The external faces of the two segments are mutually aligned such that they are flush with one another.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 2A and 2B show in each case one bearing assembly according to various embodiments, in a schematic side view or a cross-sectional view;

FIGS. 5A and 5B show in each case one bearing assembly according to various embodiments, in a method for manufacturing a bearing assembly, in a schematic perspective view;

FIG. 7 shows an end block assembly according to various embodiments, in a schematic side view;

FIG. 8 shows an end block assembly according to various embodiments, in a schematic cross-sectional view;

FIG. 13 shows an end block assembly according to various embodiments, in a schematic cross-sectional view.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling.

A bearing assembly (which may also be referred to as an expendable cartridge) may be disposed in a media end block and may have a rotatable shaft and an external housing (sleeve). Wearing components, such as, for example, bearings, water seals and vacuum seals, and brush-type members (current carbons, for example) for transmitting the electric current to the shaft, may be disposed between the sleeve and the shaft. The complete bearing assembly may be inserted into the housing of the media end block (end block housing) and/or be replaced in a pre-assembled state.

Figure 1A:
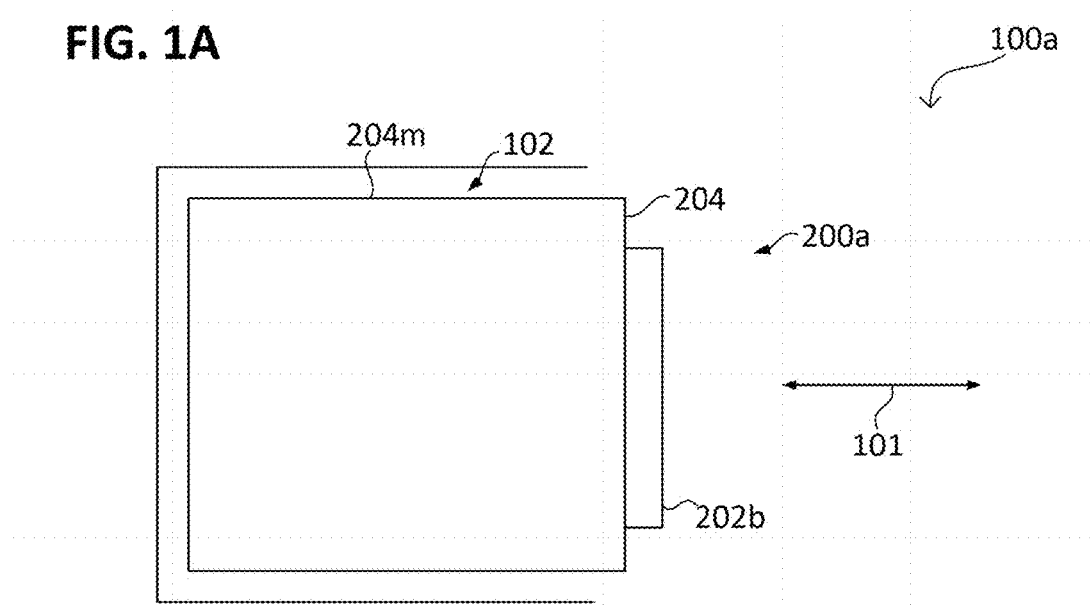
FIGS. 1A and 1B show in each case one end block assembly according to various embodiments, in a schematic side view or cross-sectional view.

FIG. 1A in an illustrative manner shows an end block assembly 100a according to various embodiments, in a schematic side view or cross-sectional view.

The end block assembly 100a may have a bearing assembly 200a which may have a coupling region 202b for coupling a tubular electrode (not illustrated) thereto. Furthermore, the end block assembly 100a may have a receptacle region 102 for receiving the bearing assembly 200a.

The bearing assembly 200a may have a sleeve 204 which supports the coupling region 202b. The sleeve 204 may be adapted in such a manner that it fits into the receptacle region 102. In other words, the sleeve 204 may be plug-fittable into the receptacle region 102, for example along the direction 101.

According to various embodiments, the sleeve 204 may be plug-fitted into the receptacle region 102; in other words, the sleeve 204 may be received in a form-fitting manner in the receptacle region 102.

The sleeve 204 may be joined together from a plurality of segments (cf. FIG. 2A), of which the external faces form a lateral surface 204m of the bearing assembly 200a.

Figure 1B:
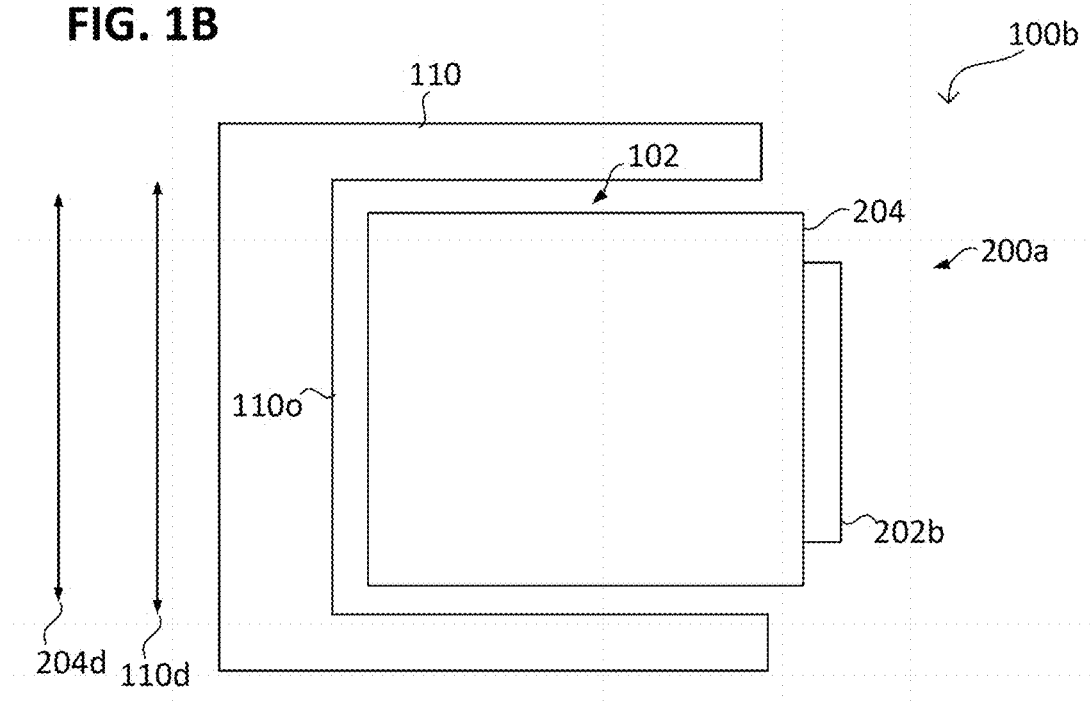

FIG. 1B in an illustrative manner shows an end block assembly 100b according to various embodiments, in a schematic side view or cross-sectional view.

The end block assembly 100b may have a housing 110 which has an opening 110o. The opening 110o may form or at least delimit the receptacle region 102.

The sleeve 204 may be plug-fittable into the opening 110o, that is to say fit into the opening 110o, when the sleeve 204 is formed so as to be smaller than the opening 110o. In other words, an extent 110d of the opening 110o (for example the diameter of the latter) may be larger than an extent 204d of the sleeve 204 (for example the diameter of the latter).

A gap which may be defined by the difference between the extent 110d of the opening 110o and the extent 204d of the sleeve 204 may thus extend between the sleeve 204 and the faces of the housing 110 that delimit the opening 110o. In this way, there may exist free space for movement for the sleeve 204 in the opening 110o, in which the sleeve 204, after having been plug-fitted, may freely move (loose fit). In other words, the extent 110d of the opening 110o may be larger than the extent 204d of the sleeve 204.

The difference between the extent 110d of the opening 110o and the extent 204d of the sleeve 204 may be smaller than 0.1 mm, for example smaller than 0.05 mm, for example smaller than 0.01 mm, for example smaller than 0.005 mm, for example smaller than 0.002 mm.

FIG. 2A in an illustrative manner shows a bearing assembly 200a according to various embodiments, in a schematic side view or cross-sectional view.

The bearing assembly 200a may have a coupling region 202b for coupling a tubular electrode (not illustrated) thereto. Furthermore, the bearing assembly 200a may have a sleeve 204 supporting the coupling region 202b.

According to various embodiments, the sleeve 204 may be joined together from a plurality of segments, for example from a first segment 204t (may also be referred to as a support segment), and from a second segment 204k (may also be referred to as a contact segment), as is illustrated in FIG. 2A. The two segments 204t, 204k (the first segment 204t and the second segment 204k) may be formed from dissimilar materials.

The external faces (also referred to as the circumferential faces) of the two segments 204t, 204k may form a lateral surface 204m (which may also be referred to as a skin surface) of the bearing assembly. The external faces of the two segments 204t, 204k may be mutually aligned such that they are flush with one another. In other words, the two segments 204t, 204k may be mutually aligned and/or formed in such a manner that the external faces thereof are flush with one another, that is to say do not have any substantial mutual offset.

For example, the first segment 204t may have an external diameter 214d which deviates from an external diameter 224d of the second segment 204k by less than 0.1 mm, for example less than 0.05 mm, for example less than 0.01 mm, for example less than 0.005 mm, for example less than 0.002 mm.

The larger external diameter 214d, 224d of the two segments 204t, 204k may define the external diameter 204d of the sleeve 204.

FIG. 2B in an illustrative manner shows a bearing assembly 200b according to various embodiments, in a schematic side view or cross-sectional view.

The bearing assembly 200b may have a bearing unit 206 which is plug-fitted into the sleeve 204 and which has a bearing 206l (for example a rolling bearing) and shaft 202 which by means of the bearing 206l is rotatably mounted. The shaft 202 on the end portion thereof may have the coupling region 202b.

Furthermore, the bearing assembly 200b may have an electrical contact structure 208 (also referred to as a second contact structure) which is disposed in the sleeve 204 (for example plug-fitted into the latter) and makes electrical contact with the shaft 202.

The contact structure 208 may be connected in an electrically conducting manner to the second segment 204k (also referred to as the contact segment). For example, the contact structure 208 may be fastened to the second segment 204k.

The contact structure 208 may form with the shaft 202 a brush-type contact 208k (also referred to as a gliding contact) which establishes an electrical connection between the second segment 204k and the rotatably mounted shaft 202 and which makes reliable contact with the shaft 202 during rotation, such that an electric current (DC or AC, for example) may flow between the second segment 204k and the shaft 202.

For example, a brush member of the contact structure 208 may bear on the lateral surface of the shaft 202, such that said brush member brushes (or glides, respectively) over the shaft 202 when the shaft 202 is rotated.

Figure 3A:
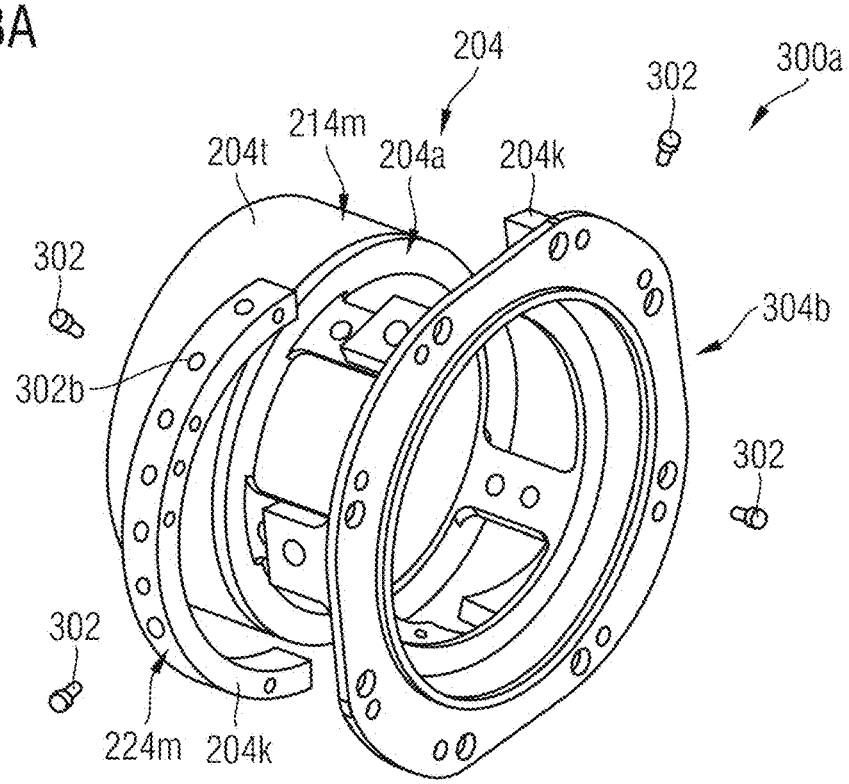
FIGS. 3A and 3B show in each case one bearing assembly according to various embodiments, in a method for manufacturing a bearing assembly, in a schematic perspective view.
Figure 3B:
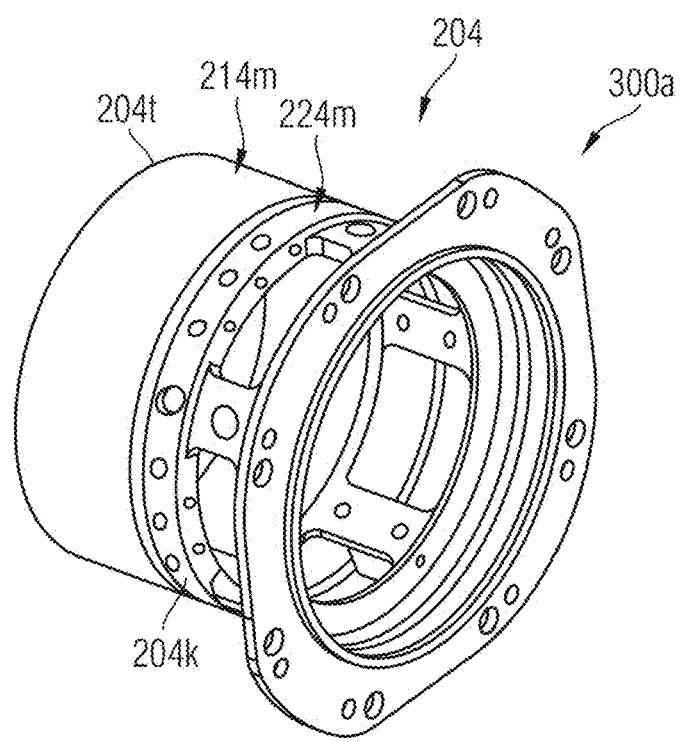

FIG. 3A and FIG. 3B in an illustrative manner show in each case one bearing assembly 300a according to various embodiments, in a method for manufacturing a bearing assembly 300a, in a schematic perspective view.

The sleeve 204 of the bearing assembly 300a (housing of the bearing assembly) may be a turned or a milled part in which a plurality of clearances and a plurality of fastening structures are formed.

For example, the sleeve 204 may have a support segment 204t which has a (for example annular) clearance 204a for receiving at least one contact segment 204k, for example two contact segments 204k, as is illustrated in FIG. 3A.

The use of two contact segments 204k may have the effect that the former may be incorporated into the clearance 204a from the outside and in this way form an annular contact of the bearing assembly 300a. In an illustrative manner, as large a contact face as possible is achieved in this way (by way of the external face of the contact segments 204k), on which contact may be made with the bearing assembly 300a.

As is shown in an illustrative manner in FIG. 3A, the contact segments 204k may be bent, for example in the shape of a shell, for example in the shape of half a shell, of a third of a shell, of a quarter of a shell, etc.

As an alternative to the bearing assembly 300a shown in an illustrative manner in FIG. 3A, according to various embodiments contact segments 204k of other shapes may also be used, and/or more than two contact segments 204k, for example three, four, or more than four contact segments 204k may be used.

The contact segments 204k shown in an illustrative manner in FIG. 3A may have been or may be fastened to the support segment 204t by means of screws 302, for example to a fastening structure (holes and/or threads, for example) of the support segment 204t.

According to various embodiments, the support segment 204t may have a stable material (first material) for reinforcing the bearing assembly 300a, or may be formed therefrom.

The first material may have a metal, for example, or be formed therefrom, for example a metallic element such as iron (Fe), aluminum (Al), titanium (Ti), magnesium (Mg), platinum (Pt), or chromium (Cr). Alternatively or additionally, the metal may have a metallic compound (for example an inter-metallic compound or an alloy, such as an aluminum alloy or an iron alloy, for example) or be formed therefrom, for example a compound of at least two metallic elements such as aluminum bronze or brass, for example, or for example a compound of at least one metallic element and at least one non-metallic element, such as for example steel, for example stainless steel.

According to various embodiments, at least one of the contact segments 204k (for example two or more than two contact segments 204k) may be formed from a second material. The second material may have a metal, for example, or be formed therefrom, for example a metallic element such as copper (Cu), aluminum (Al), gold (Au), silver (Ag), magnesium (Mg), or platinum (Pt). Alternatively or additionally, the metal may have a metallic compound (for example an inter-metallic compound or an alloy, such as a copper alloy, for example), or may be formed therefrom, for example a compound of at least two metallic elements, such as copper and silver, for example, or, for example, a compound of at least one metallic element and at least one non-metallic element.

The second material may have copper of high purity (so-called pure copper), for example, or be formed therefrom, for example pure copper having high electrical conductivity (so-called electro copper), for example Cu-ETP (electrolytic tough-pitch copper, may also be referred to as E-Cu58, E-Cu57 or E-Cu), Cu-FRHC (fire-refined tough-pitch high conductivity copper), Cu-OF (oxygen-free copper), Cu-PHC (phosphorus deoxidized high conductivity copper), Cu-HCP (high conductivity phosphorus deoxidized copper), Cu-DLP (phosphorus-deoxidized copper with low residual phosphorus), Cu-DHP (phosphorus-deoxidized copper with high residual phosphorus).

The second material, for example pure copper, may have impurities (for example non-metallic impurities, for example oxygen) to a very minor extent, for example of less than 0.10% at (atomic percentage), for example of less than 0.06% at, for example of less than 0.04% at, for example of less than 0.02% at, for example of less than 0.01% at. On account thereof, particularly high electrical conductivity may be achieved.

According to various embodiments, a minor amount of silver, for example less than 0.12% at, for example less than 0.05% at, for example in a range from approx. 0.03% at to approx. 0.12% at, may be added to the second material, for example copper, for example electro copper. Alternatively or additionally, the second material, for example copper, for example electro copper, may be coated with silver (and/or gold) on the external side thereof, for example.

Electro copper may have electrical conductivity in a range from approx. $40 \cdot 10^6 \, \Omega^{-1} \cdot m^{-1}$ to approx. $60 \cdot 10^6 \, \Omega^{-1} \cdot m^{-1}$, for example in a range from approx. $55 \cdot 10^6 \, \Omega^{-1} \cdot m^{-1}$ to approx. $60 \cdot 10^6 \, \Omega^{-1} \cdot m^{-1}$.

For example, the contact segments 204k may have been or may be configured as copper half-shells which for assembly of the bearing assembly 300a are placed into the clearances 204a in the support segment 204t and are screwed to the support segment 204t, as is shown in an illustrative manner in FIG. 3B.

According to various embodiments, the sleeve 204 of the bearing assembly 300a may have been or may be made by means of a turning process and/or by means of a milling process. For example, the support segment 204t may have been or may be made from round bar stock (semi-finished product), for example when no corresponding tube is available as semi-finished product. In a further method step, a through opening (along the axis) may have been or may be formed in the round bar stock, such that the latter becomes tubular.

Figure 11A:
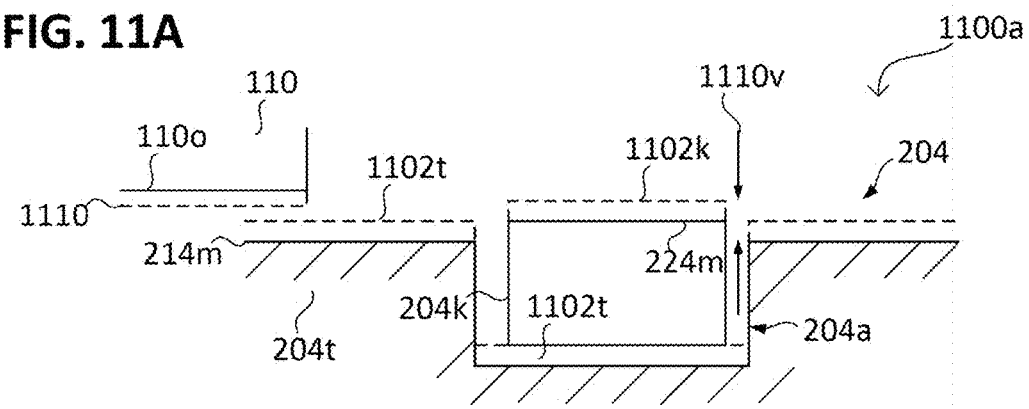
FIGS. 11A and 11C show in each case one bearing assembly according to various embodiments, in a method for manufacturing a bearing assembly, in a schematic side view or cross-sectional view.

On account of a contact segment 204k being fastened in the clearance 204a, the tolerance range with which the contact segment 204k is made (production tolerance) and the tolerance range with which the clearance 204a is made may add up (cf. FIG. 11A). Furthermore, accurate positioning and fastening of the contact segment 204k in the clearance 204a may be limited by the tolerance range with which the bores 302b and threads (for the screws 302) are made. These tolerances may be mutually superimposed and add up (to result in a deviation) such that the resulting tolerance with which the external face 224m of the contact segment 204k and the external face 214m of the support segment 204t may be aligned with one another may be larger than the individual tolerance ranges of production (production tolerances).

On account thereof, an offset may be created between the external face 224m of the contact segment 204k and the external face 214m of the support segment 204t (cf. FIG. 11A). On account of the offset, the external diameter 204d of the bearing assembly 300a may be larger than the external diameter 214d of the support segment 204t, or than the external diameter 224d of the contact segment 204k per se (cf. FIG. 1B and FIG. 2A). On account thereof, incorporating the bearing assembly 300a into the receptacle region 102 may have been or may be impeded.

For example, inserting the bearing assembly 300a into the housing 110 of the end block (of the media end block) may lead to jamming on the external diameter 204d of the bearing assembly 300a. The reason therefor is that the tolerated external diameter 204d on the housing of the bearing assembly 300a cannot be ensured on the screwed contact segments 204k (for example copper half-shells) (additional inaccuracies due to the screw connection).

Furthermore, making electrical contact with the copper half-shells via the angular flat contact 802w may be compromised or even not function at all. The reason therefor is likewise the external diameter 204d on the contact segments 204k that cannot be ensured. On account thereof, the transfer of current may be compromised on the contact point 208k (cf. FIG. 2B). For example, the transition resistance between the contact structure 208 and the contact segments 204k may have been or may be increased, and increased resistance losses which heat the bearing assembly 300a may thus arise.

According to various embodiments, the external faces 214m, 224m of the contact segment 204k and of the support segment 204t may be mutually aligned. To this end, the production complexity may have been or may be increased, for example, in that the production tolerances are reduced, for example.

Alternatively or additionally, an analysis of the completed segments 204k, 204t of the bearing assembly 300a may be performed and the segments 204k, 204t may be classified on the basis of the analysis, or components not meeting the requirements may be eliminated. Joining together may then be performed under consideration of the classification (or of the analysis, respectively), such that mutually matching segments 204k, 204t may be joined together (screwed together, for example). In an illustrative manner, contact segments 204k which turn out to be of excessive size may be placed and screwed into clearances 204a which turn out to be of excessive size. The tolerance ranges 1102t, 1102k with which the segments 204k, 204t are made may thus mutually overlap (cf. FIG. 11C, for example).

Alternatively or additionally, the segments 204k, 204t may be joined together using a jig, such that a deviation which has been created by production is compensated for by a tolerance enabled by the bores and threads. For example, to this end the threads and bores may run in a transverse manner to the external faces 214m, 224m, and/or the clearance 204a may have an oblique base area, such that lateral displacement of the contact segments 204k in the clearance 204a causes a change in the installation height. The tolerance ranges 1102t, 1102k with which the segments 204k, 204t are made may thus mutually overlap (cf. FIG. 11C, for example).

The support segment 204t may have a fastening structure 304b, for example in the form of a radially projecting portion which may have one or a plurality of through openings (bores, for example), grooves, or springs for fastening the sleeve 204 to a respective fastening structure of the end block housing (not illustrated), which surrounds the opening 110o, for example.

For example, the sleeve 204 at the position of the clearance 204a may have an internal diameter in a range from approx. 50 mm to approx. 150 mm, for example approx. 100 mm. For example, the support segment 204t may furthermore have an external diameter 204d in a range from approx. 50 mm to approx. 150 mm, for example approx. 130 mm. For example, the wall thickness for the sleeve 204 may be in a range from approx. 2 mm to approx. 30 mm, for example in a range from approx. 2 mm to approx. 10 mm, or alternatively, for example, in a range from approx. 10 mm to approx. 30 mm, for example approx. 15 mm.

Figure 4A:
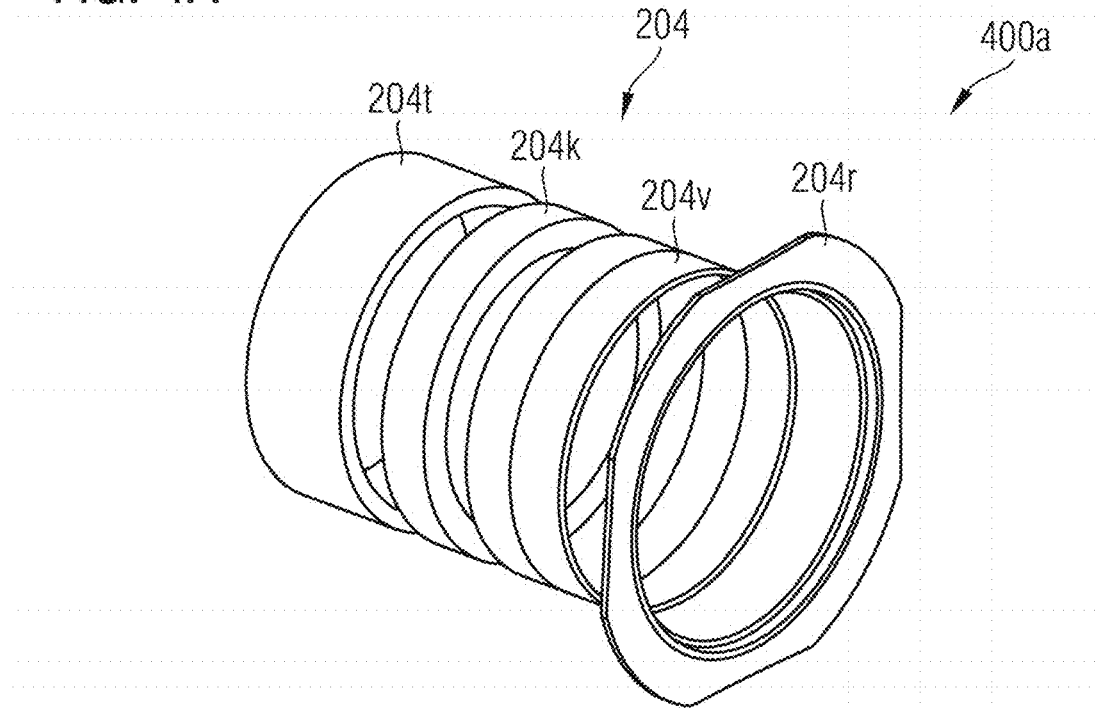
FIGS. 4A and 4B show in each case one bearing assembly according to various embodiments, in a method for manufacturing a bearing assembly, in a schematic perspective view.

FIG. 4A in an illustrative manner shows a bearing assembly 400a according to various embodiments, in a method for manufacturing a bearing assembly, in a schematic perspective view.

Alternatively to the bearing assembly 300a shown in an illustrative manner in FIG. 3A, the bearing assembly 400a may have more than two segments which, once joined together, result in the sleeve 204, as is shown in an illustrative manner in FIG. 4A.

For example, a first segment 204t (support segment 204t), a second segment 204k (contact segment 204k), a third segment 204v (also referred to as a connection segment), and a fourth segment 204r (also referred to as a radial segment) may have been or may be joined together to form the sleeve.

The support segment 204t and the contact segment 204k may have been or may be adapted as has been described above.

The connection segment 204v may connect the radial segment 204r to the contact segment 204k. The connection segment 204v in an illustrative manner may serve in designing the contact segment 204k to be as short as possible such that the smallest amount possible of cost-intensive pure copper is required, for example.

In an analogous manner to the support segment 204t, the connection segment 204v may have the first material, or alternatively thereto another material (a third material) which differs from the first material. The third material may have a metal, for example, or be formed therefrom, for example a metallic element such as iron (Fe), aluminum (Al), titanium (Ti), magnesium (Mg), or platinum (Pt). Alternatively or additionally, the metal may have a metallic compound (for example an inter-metallic compound or an alloy, such as an aluminum alloy or an iron alloy, for example), for example a compound of at least two metallic elements such as aluminum bronze or brass, for example, or for example a compound of at least one metallic element and at least one non-metallic element, such as steel, for example.

For example, the first material may have steel or be formed therefrom, and the third material may have aluminum or be formed therefrom.

In an analogous manner to the support segment 204t, the radial segment 204r may have the first material and/or the second material, or alternatively thereto another material (a fourth material) which differs from the first material and/or differs from the third material. The fourth material may have a metal, for example, or be formed therefrom, for example a metallic element such as iron (Fe), aluminum (Al), titanium (Ti), magnesium (Mg), or platinum (Pt). Alternatively or additionally, the metal may have a metallic compound (for example an inter-metallic compound or an alloy, such as an aluminum alloy or an iron alloy, for example), for example a compound of at least two metallic elements such as aluminum bronze or brass, for example, or for example a compound of at least one metallic element and at least one non-metallic element, such as steel, for example.

For example, the first material may have steel or be formed therefrom, and the fourth material may have aluminum or be formed therefrom.

The segments 204t, 204k, 204v, 204r of the bearing assembly 400a may have been or may be joined together by means of a joining process (also referred to as a joining method or a connecting process), for example by means of an adhesive process or by means of a welding process, for example by means of a friction-welding process (cf. FIG. 9A to FIG. 9C) or by means of an electric welding process, for example of an electron-beam welding process or of an MIAB welding process (magnetically impelled arc butt welding). The joining process used may have been or may be adapted to the materials of the segments 204*t*, 204*k*, 204*v*, 204*r*.

Figure 4B:
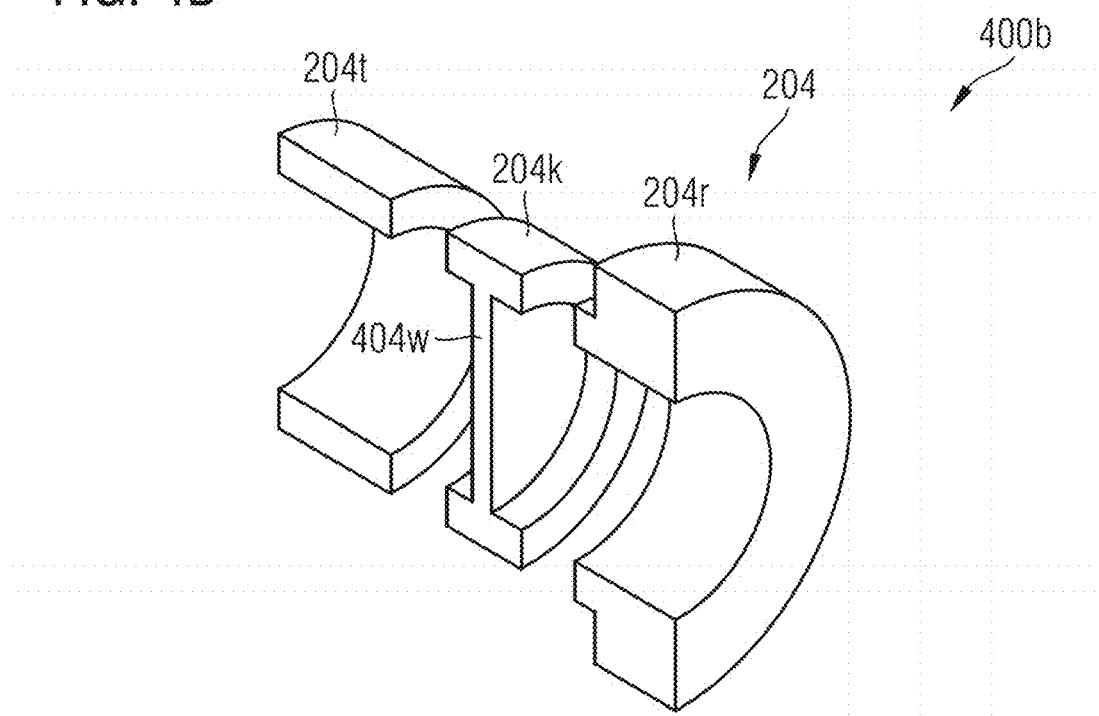

FIG. 4B in an illustrative manner shows a bearing assembly 400*b* according to various embodiments, in a method for manufacturing a bearing assembly 400*b*, in a schematic perspective view.

Alternatively to the bearing assemblies previously shown in an illustrative manner, the bearing assembly 400*b* may have three segments 204*t*, 204*k*, 204*r* which, once joined together, result in the sleeve 204, as is shown in an illustrative manner in FIG. 4A.

In the example shown in an illustrative manner in FIG. 4B, the radial segment 204*r* may be connected directly to the contact segment 204*k*.

The segments 204*t*, 204*k*, 204*r* joined together may be semi-finished products, for example, which once joined together are further machined, as will be further discussed hereunder.

According to various embodiments, at least one (that is to say one, two, or all) of the segments 204*t*, 204*k*, 204*r* may have been or may be formed from tubular semi-finished products. In order for the tubular semi-finished products to withstand the mechanical stresses during joining, for example when pressure is exerted on the tubular semi-finished products, the latter may have been or may be reinforced by wall elements 404*w*. Alternatively or additionally, at least one (that is to say one, two, or all) of the segments 204*t*, 204*k*, 204*r* may have been or may be formed from semi-finished products in the form of round bar stock (that is to say as a solid material).

FIG. 5A in an illustrative manner shows a bearing assembly 500*a* according to various embodiments, in a method for manufacturing a bearing assembly 500*a*, in a schematic perspective view.

The bearing assembly 500*a* shown in an illustrative manner in FIG. 5A shows the sleeve 204 in a method step after the segments of the sleeve 204 have been joined together.

The bearing assembly 500*a* shown in an illustrative manner in FIG. 5A may for example have been or may be manufactured from the bearing assemblies 400*a*, 400*b* shown in an illustrative manner in FIG. 4A or FIG. 4B, for example once the segments of said bearing assemblies have been joined together.

Each of the segments which have been joined together to form the sleeve 204 may form one portion of the sleeve 204. For example, the contact segment 204*k* may form a contact portion of the joined sleeve 204. For example, the radial segment 204*r* may form a radially projecting portion 304*r* of the sleeve 204, etc.

As has been described above, a connection portion may have been or may be connected to the other segments as a separate segment (connection segment 204*v*), or may have been or may be connected to the other segments as part of the radial segment 204*r*. For example, the radial segment 204*r* may have been or may be machined prior to or after having been joined together, for example in order to form a radially projecting portion 304*r* of the sleeve 204.

Figure 9A:
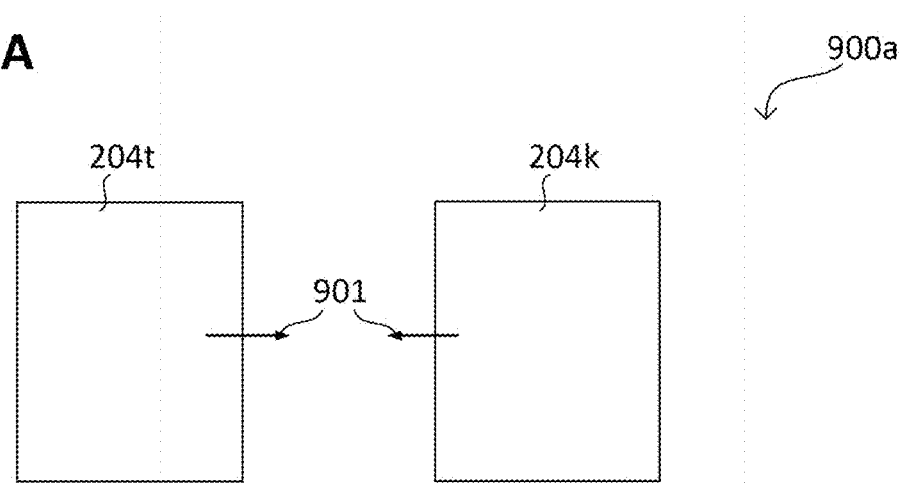
FIGS. 9A to 9C show in each case one bearing assembly according to various embodiments, in a method for manufacturing a bearing assembly, in a schematic side view or cross-sectional view.
Figure 9B:
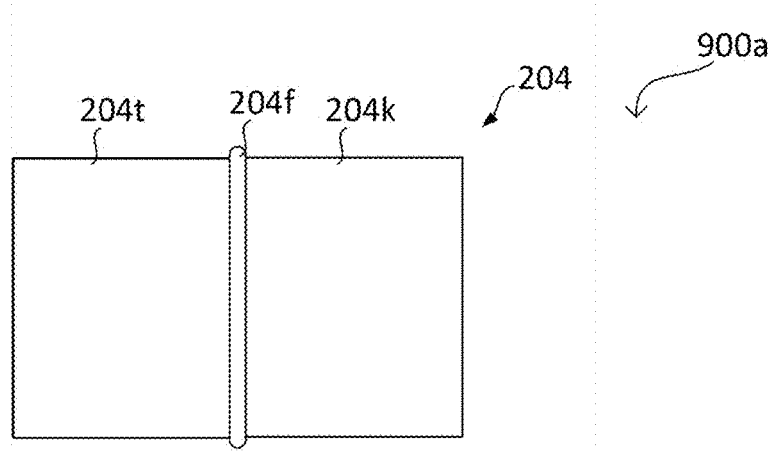
Figure 9C:
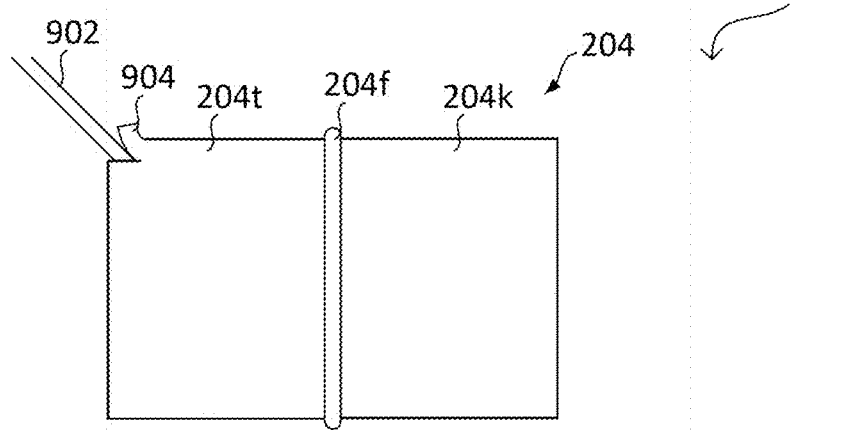
Figure 10A:
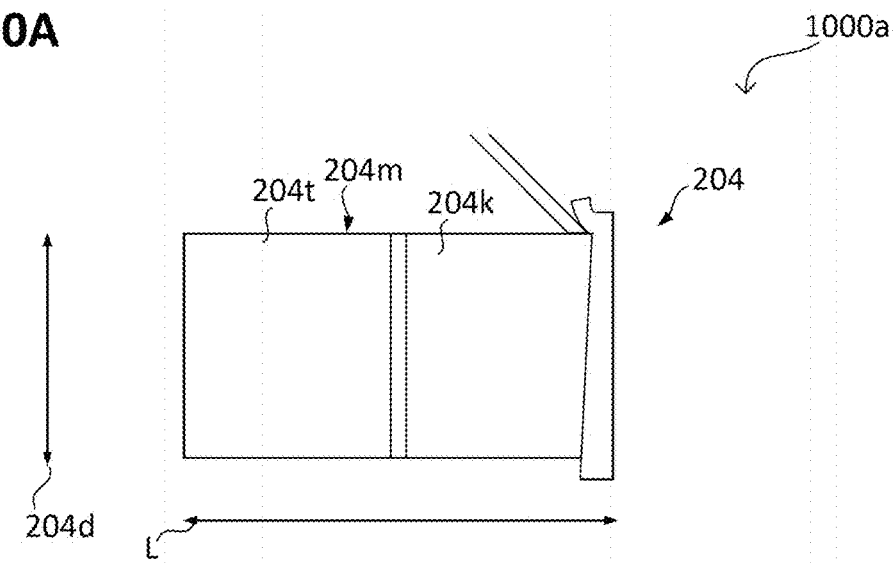
FIGS. 10A and 10C show in each case one bearing assembly according to various embodiments, in a method for manufacturing a bearing assembly, in a schematic side view or cross-sectional view.

According to various embodiments, the external faces 214*m*, 224*m*, 234*m* of the segments 204*t*, 204*k*, 204*v* (that is to say the external side thereof) may have been or may be machined, such that the external faces 214*m*, 224*m*, 234*m* of the segments 204*t*, 204*k*, 204*v* are mutually aligned (cf. FIG. 9C or FIG. 10A, for example). The external faces 214*m*, 224*m*, 234*m* may form the lateral surface 204*m* of the sleeve 204 and may be mutually adjacent in a flush manner, for example.

Figure 10B:
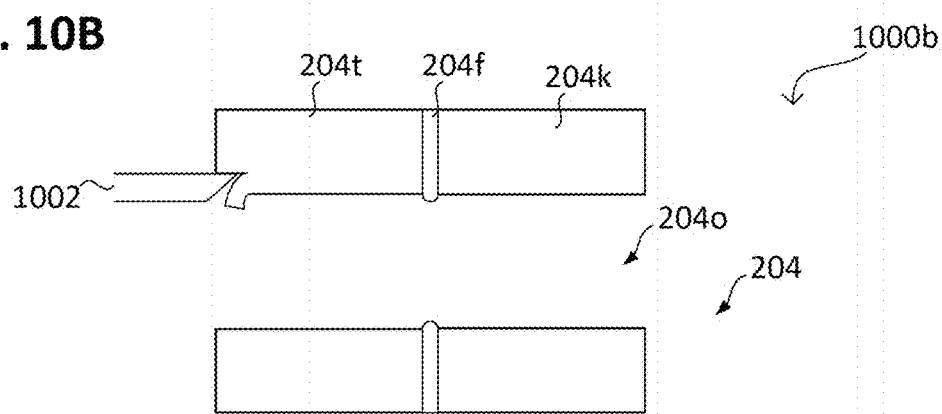

Optionally, the internal faces of the segments 204*t*, 204*k*, 204*r*, 204*v* (that is to say the internal side thereof) may have been machined (cf. FIG. 10B, for example).

FIG. 5B in an illustrative manner shows a bearing assembly 500*b* according to various embodiments, in a method for manufacturing a bearing assembly, in a schematic perspective view.

The bearing assembly 500*b* shown in an illustrative manner in FIG. 5B shows the sleeve 204 in a method step after the segments of the sleeve 204 have been joined together and/or after the radially projecting portion 304*r* of the sleeve 204 has been formed and/or after the external side of the segments 204*t*, 204*k*, 204*v*, or of the sleeve 204, respectively, has been machined.

The bearing assembly 500*b* shown in an illustrative manner in FIG. 5B may have been or may be manufactured from the bearing assemblies 400*a*, 400*b*, 500*a* which are shown in an illustrative manner in FIG. 4A, FIG. 4B, or FIG. 5A, for example.

(Lateral) through openings 502*o* may optionally have been or be formed in the connection segment 204*r* (connection portion). Furthermore, a fastening structure 504*b* (one of the plurality of bores and/or threads, for example) may have been or may be formed in the connection segment 204*v*.

Optionally, a fastening structure 506*b* (one of the plurality of bores and/or threads, for example) may have been or may be formed in the contact segment 204*k* (contact portion).

Optionally, a fastening structure 304*b* (one of the plurality of bores and/or threads, for example) may have been or may be formed in the radially projecting portion 304*r* of the sleeve 204.

Figure 6:
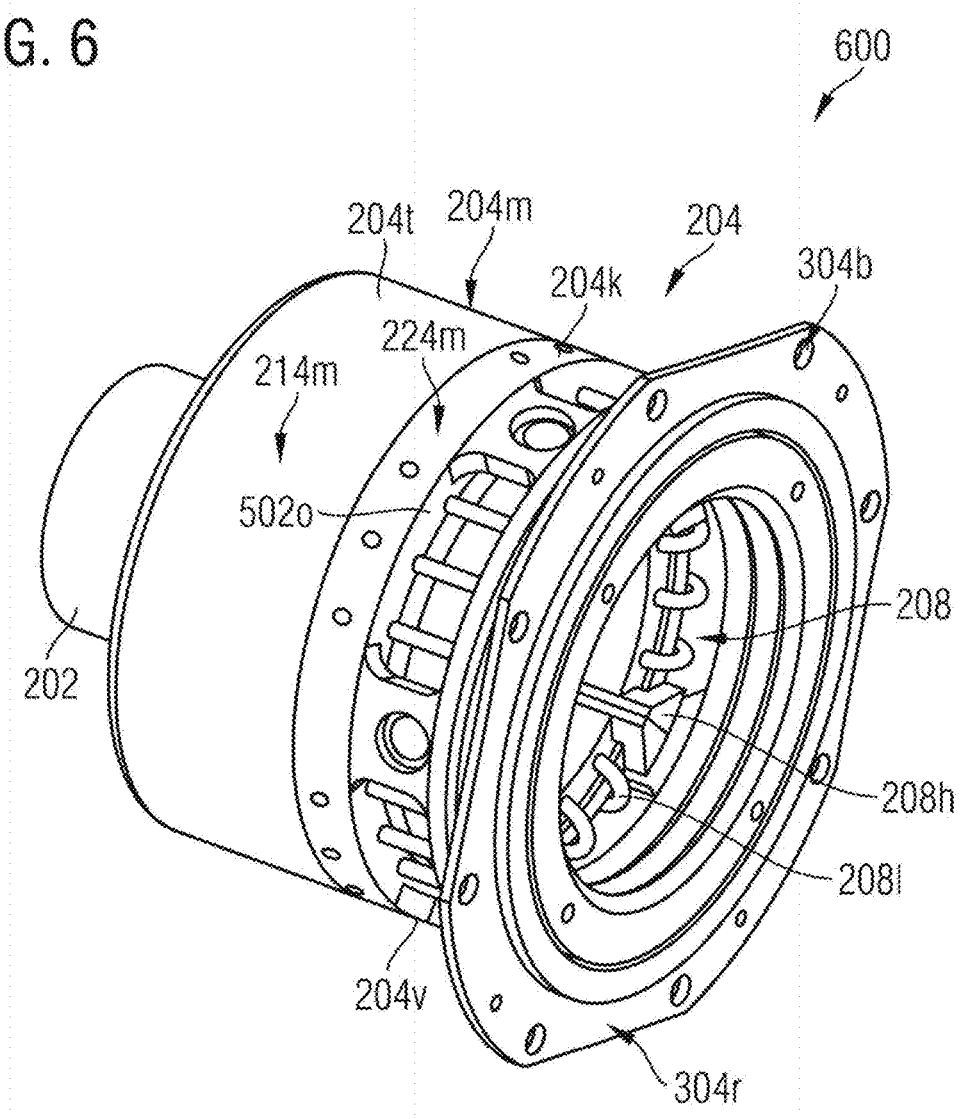
FIG. 6 shows a bearing assembly according to various embodiments, in a method for manufacturing a bearing assembly, in a schematic perspective view.

FIG. 6 in an illustrative manner shows a bearing assembly 600 according to various embodiments, in a method for manufacturing a bearing assembly, in a schematic perspective view.

The bearing assembly 600 shown in an illustrative manner in FIG. 6 shows the bearing assembly 600 in a method step after one of the method steps previously described.

The fastening structures in the connection segment 204*v* and in the contact segment 204*k* may serve for fastening a contact structure 208 (a second contact structure) to the sleeve 204. For example, electrical infeeds 208*l* (for example copper cables) may be connected to the contact segment 204*k* and electrical contact be made. Furthermore, a mounting 208*h* may have been or may be disposed in the interior of the sleeve 204 and fastened to the connection segment 204*v*. The mounting 208*h* may serve for receiving and holding brush-type members.

Furthermore, a shaft 202 (front part illustrated so as to be transparent) may have been or may be received in the sleeve 204, as has been described above.

FIG. 7 in an illustrative manner shows an end block assembly 700 according to various embodiments, in a schematic side view.

The end block assembly 700 may have an end block housing 110 which by means of an opening 110*o* provides a receptacle region. Furthermore, the end block assembly 700 may have a bearing assembly 200*a* or another one of the bearing assemblies described above, for example the bearing assemblies 600.

The bearing assembly 200a may be plug-fitted along a direction 101 into the opening 110o, such that the former is received in a form-fitting manner in the opening 110o.

The fastening structure in the radial portion 304r may have a plurality of screws, for example, which may be screwed into matching threaded bores in the end block housing 110 when the bearing assembly 200a is plug-fitted into the opening 110o.

The lateral surface 204m of the bearing assembly 200a may be free of any offset (for example from an elevation or unevenness) and have a uniform external diameter 204d along that portion 702e (plug-fitting portion) of the bearing assembly 200a that is plug-fitted into the opening 110o.

Alternatively, at least the connection segment 204v may have an external diameter which is larger than the external diameter 204d. In this way, protection of the static sealing faces in the end block housing 110 may be achieved.

FIG. 8 in an illustrative manner shows an end block assembly 800 according to various embodiments, in a schematic cross-section view, for example through the end block assembly 700 having a plug-fitted bearing assembly 200a (or another one of the bearing assemblies described above, for example having the plug-fitted bearing assemblies 600).

The bearing assembly 200a may have the shaft 202, as has been described above. The shaft 202 may have been or may be plug-fitted into the sleeve 204. Furthermore, the bearing assembly 200a may have a coupling flange 611 (optionally having one or a plurality of connection elements, such as two or more than two clamping half-shells, for example), coupled to the shaft 202, for coupling a tubular electrode (also referred to as a cathode tube) thereto.

According to various embodiments, the end block assembly 800 may have a first electrical contact structure 802 which may have an angular flat contact 802w and a plug contact 802s. The angular flat contact 802w may infeed electric power to the plug contact 802s. The plug contact 802s may be adapted so as to form electrical contact with the contact segment 204k or with the external face 224m (shown so as to be transparent in the illustration) thereof, for example in the case of the bearing assembly 200a being plug-fitted into the end block housing 110.

In this way, reliable transfer of power from the angular flat contact 802w to the bearing assembly 200a may be achieved.

According to various embodiments, the contact segment 204k serves for improved electrical contact with the bearing assembly 200a via the angular flat contact 802w.

According to various embodiments, the bearing assembly 200a may furthermore have a second electrical contact structure 208. The second contact structure 208 may have electrical infeeds 2081, for example in the form of current lines, and brush-type members 208s, for example in the form of current carbons (may also be referred to as carbon brushes). The electrical infeeds 2081 may have been or may be screwed into the contact segment 204k and direct the electric current to the brush-type members 208s. The brush-type members 208s may form electrical contact with a lateral surface 206m of the shaft 202, for example in the case of the shaft 202 being plug-fitted into the sleeve 204.

The brush-type member or members 208s, respectively, may have been or may be held or mounted by means of a mounting (may also be referred to as a carbon-brush cage). The mounting and the brush-type members form a so-called contact brush ring or a carbon brush ring, respectively, which annularly surrounds the shaft 202 to be electrically contacted.

As is shown in an illustrative manner in FIG. 8, the end block assembly 800 may furthermore have a coolant infeed 804 (for example, tubes and/or clearances in the housing may be component parts of the coolant infeed 804) for inducing coolant (for example cooling water) into the housing 110 and/or for discharging coolant from the housing 110. Furthermore, a corresponding coolant coupling (for example in the form of a flange) may have been or may be provided in the housing 110 for coupling the coolant infeed 804 to the shaft. For example, the end block assembly 300 may have a flange which may be adapted in such a manner, for example, that the coolant may be directed into the shaft 202 or out of the shaft 202.

FIG. 9A, FIG. 9B and FIG. 9C in each case show in an illustrative manner one bearing assembly according to various embodiments, in a method for manufacturing a bearing assembly, in a schematic side view or cross-sectional view, for example the bearing assembly 200a or another one of the previously described bearing assemblies, for example the bearing assemblies 600.

FIG. 9A in an illustrative manner shows by way of example joining 900a according to various embodiments, in that a plurality of segments, for example the first segment 204t and the second segment 204k, are joined together.

For example, joining 900a may be performed by means of a welding process, for example by means of a friction welding process, as will be discussed hereunder.

In a friction welding process, the two segments 204k, 204t are moved toward one another (first movement), for example along a direction 901, until said two segments touch one another and form a contact area (that is to say that the two segments 204k, 204t are brought into mutual contact). While moving toward one another, the two segments 204k, 204t are moved in a transverse manner to that movement (second movement), for example in a transverse manner to the direction 901, for example rotated about the direction 901.

Once the two segments 204k, 204t touch one another, they are pressed against one another while the second movement (for example rotation) is maintained, such that friction arises between said two segments 204k, 204t on the contact area (joint area). On account of the friction between the two segments 204k, 204t on the contact area, heat which heats and softens the material on the contact area is generated. The heated regions (contact regions) of the two segments 204k, 204t are interconnected by this process and form a joint region 204f (cf. FIG. 9B).

If the two segments 204k, 204t are pressed against one another under rotation, reference is made to so-called spin friction welding.

In other words, the supply of energy for jointing (joining together) the two segments 204k, 204t is introduced by way of the relative movement between the two segments 204k, 204t under pressure.

Alternatively to friction welding, other jointing processes, for example another welding process, such as electron beam welding, an adhesive process, screwing (cf. FIG. 3A and FIG. 3B), doweling, and/or a brazing/soldering process may also be used. In other words, a form-fitting connection and a materially integral connection between the two segments 204k, 204t are possible in combination.

An adhesive process or a brazing/soldering process may lead to a jointing region 204f which may have lower mechanical or thermal resistance than a jointing region which is formed by means of a welding process or screwing. Lower mechanical or thermal resistance may lead to premature failure of the connection between the two segments 204k, 204t, for example at high temperatures and/or in the case of heavy electrodes.

A multiplicity of materials may be joined together, for example welded together, such as, for example, aluminum and steel, or copper and steel, or copper and aluminum. Joining (connecting) metallic materials which do not form a common alloy is also possible in this way.

For example, two tubes (one tube for each segment), for example a tube of (for example stainless) steel, which forms the support segment 204t, and a copper tube (or a copper bar) which forms the contact segment 204k, are interconnected. The tubes may have been or may be provided as (tubular) semi-finished products.

In an analogous manner, more than two segments may be interconnected, for example successively (cf. FIG. 4A or FIG. 4B). For example, these segments may be interconnected by friction welding in the sequence steel-copper-steel, on account of which one steel segment (corresponding to the support segment 204t), one copper segment (corresponding to the contact segment 204k), and one further steel segment (corresponding to the radial segment 204r or to the connection segment 204v) are interconnected.

For example, due to the high purity and excellent electrical conductivity of electro copper, the copper segment may have been or may be formed from electro copper. For example, electro copper of the brand Cu-ETP (CW 004A) 2.0060 may be used.

If the steel segment in the form of the connection segment 204v is connected to the copper segment (cf. FIG. 4A), the radial segment 204r, in the form of a flange which serves for fastening the bearing assembly to the end block housing 110, may subsequently be welded thereto, for example by means of a friction welding process or by means of another welding process.

Alternatively, the flange may already be integrated in one of the two friction-welded steel tubes (corresponding to the radial segment 204r); for example, the flange may be cut after the segments have been joined together.

After joining 900a (for example after establishing the weld connection), the sleeve 204 may have a joint region 204f which is created for example by pressing the two segments 204t, 204k together during friction welding (for example spin welding), as is illustrated in FIG. 9B. The joint region 204f may for example be enlarged, for example by a welding process, as is illustrated in an exemplary manner in FIG. 9B.

The method may furthermore comprise machining 900c of the external side of the sleeve 204, as is shown in an illustrative manner in FIG. 9C. An outer shell 904 may here be removed from the sleeve 204, such that the external faces of the two segments 204k, 204t are flush with one another and form the lateral surface 204m of the sleeve 204.

For example, a machining process, for example a turning process (turning), may be used for machining the sleeve 204. For example, to this end a cutting tool 902 (for example a cutting chisel) which has been or is fastened at a defined position in relation to the sleeve 204 while the sleeve 204 under rotation is guided past the cutting tool 902 may be used. On account thereof, a chip 904 may be removed from the sleeve 204, for example (also referred to as chip removal or subtractive machining).

Alternatively or additionally, another machining process, for example a shape-imparting machining process, may be used for machining the sleeve 204, for example an abrasive process (abrading), a milling process (milling), a sawing process (sawing), and/or a boring process (boring).

Alternatively, at least the enlarged joint region 204f may be removed during machining of the sleeve 204 (for example by finish turning).

Figure 10C:
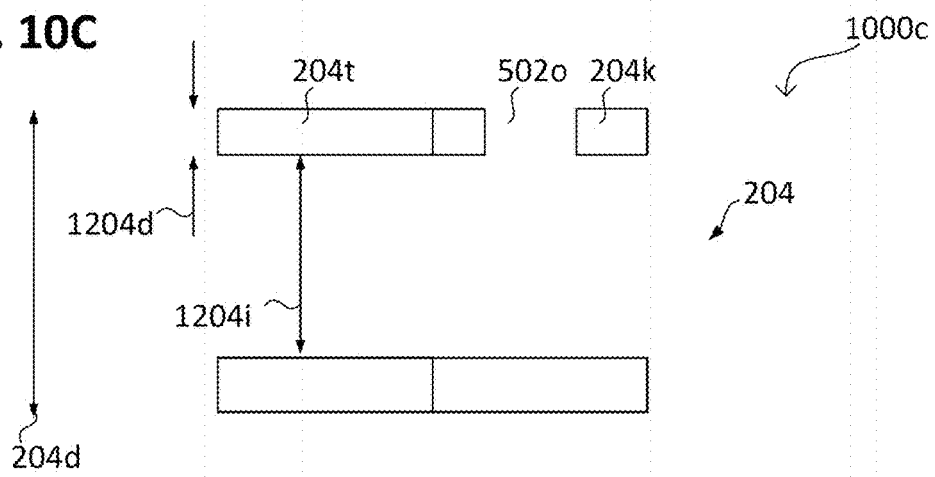

FIG. 10A, FIG. 10B and FIG. 10C in each case show in an illustrative manner one bearing assembly according to various embodiments, in a method for manufacturing a bearing assembly, in a schematic side view or cross-sectional view, for example the bearing assembly 200a or another one of the previously described bearing assemblies, for example the bearing assemblies 600.

FIG. 10A in an illustrative manner shows machining 1000a of an external side of the sleeve 204.

By means of machining the sleeve 204, the bearing assembly may be brought to the external diameter 204d, for example across the entire length L of the sleeve 204, as is shown in an illustrative manner in FIG. 10A.

By way of an external diameter 204d having a precise fit, the expendable cartridge may be readily (that is to say with a low effort of force) inserted into (fitted in) the end block housing 110, for example pushed thereinto, or pulled out therefrom (disassembled), for example extracted.

On account thereof, electrical contact via the angular flat contact 802w with the bearing assembly, or the contact segment 204k, respectively, and thus with the electrode (also referred to as the target) may be improved. This contributes toward process reliability and process precision in a coating system (targeted current transition).

According to various embodiments, simple and cost-effective semi-finished products may be used (for example tubes) for forming the segments. On account thereof, production costs are lowered.

This enables a sleeve 204 of which the external face forms an offset-free lateral surface 204m of the bearing assembly and which has at least two segments from dissimilar materials to be formed.

Furthermore, the method may optionally comprise machining 1000b of the internal face of the sleeve 204, this being shown in an illustrative manner in FIG. 10B. An opening 204o (for example an axial through opening) in the sleeve 204, for receiving the bearing unit and the second contact structure, may be formed by means of machining the internal face of the sleeve 204, as has been described above. If bar-shaped supports, that is to say bar stock, are used for forming the segments, it may be necessary for the opening 204o to be formed by boring or milling.

Alternatively or additionally, and in an analogous manner to the external side of the sleeve 204, a shell, or a chip, respectively, may be removed from the internal side of the sleeve 204 (for example when tubular supports, that is to say tubes, are used for forming the segments), for example in a chip-removing manner, for example by means of a cutting tool 1002, as is shown in an illustrative manner in FIG. 10B.

For example, the wall thickness 1204d of the machined sleeve 204 may be in a range from approx. 2 mm to approx. 30 mm, for example in a range from approx. 2 mm to approx. 10 mm, or alternatively for example in a range from approx. 10 mm to approx. 30 mm, for example approx. 15 mm. For example, the sleeve 204 may have an internal diameter 1204i of approx. 50 mm to approx. 150 mm, for example approx. 100 mm.

The method may optionally comprise forming 1000c one or a plurality of lateral through openings 502o, as is shown in an illustrative manner in FIG. 10C, for example by means of a milling process and/or a boring process.

Figure 11B:
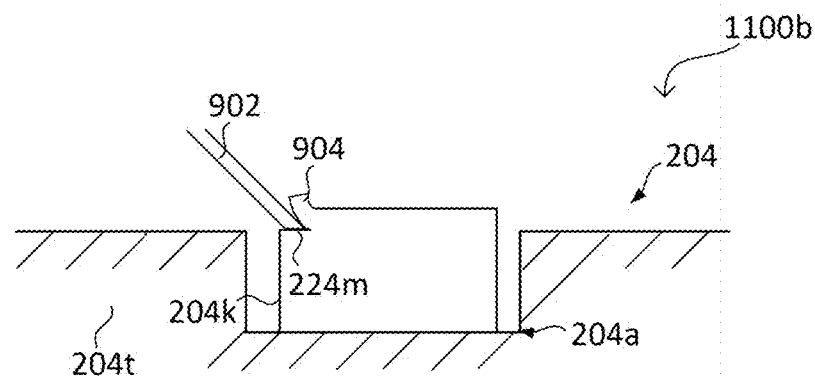
Figure 11C:
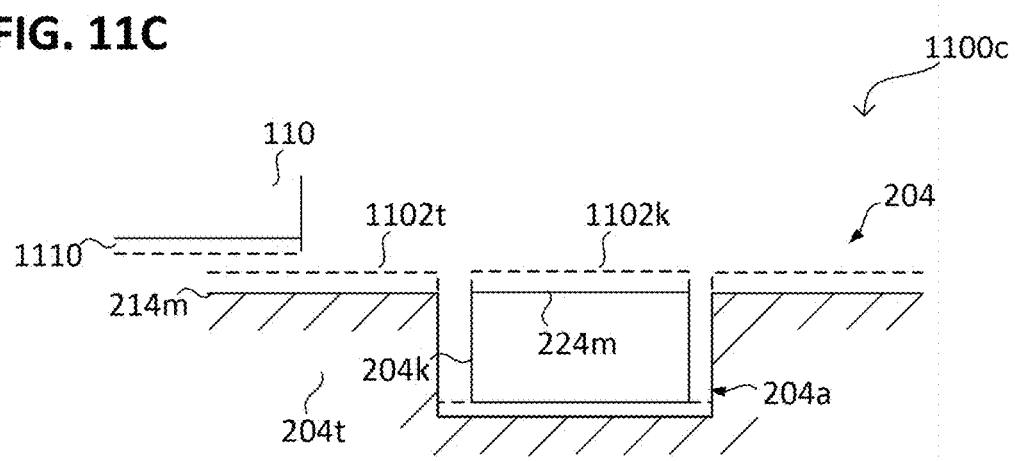

FIG. 11A, FIG. 11B and FIG. 11C in each case show in an illustrative manner one bearing assembly according to various embodiments, in a method for manufacturing a bearing assembly, in a schematic side view or cross-sectional view.

FIG. 11A in an exemplary manner shows in an illustrative manner joining 1100a according to various embodiments, in that the second segment 204k has been or is disposed in a clearance 204a in the first segment 204t.

The production of workpieces, for example of the segments of the sleeve 204, is subject to certain production tolerances. In an illustrative manner, the sleeve 204 may turn out to be excessively large for the opening, for example, since the production process is subject to production tolerances and the external face of the sleeve 204 cannot be produced in an arbitrarily precise manner. This has the consequence that an external face of the sleeve 204, for example an external face 214m of the first segment 204t, has a tolerance range 1102t (also referred to as a tolerance field) in which the actual dimensions of the sleeve 204 lie.

In an analogous manner thereto, the opening 110o in the housing 110 may have a tolerance range 1110, and an external face 214m of the second segment 204k may have a tolerance range 1102k. Likewise, the clearance 204a in which the second segment 204k has been or is disposed may have the tolerance range 1202t.

If the second segment 204k is disposed in the clearance 204a, the tolerance range 1102t of the clearance 204a and the tolerance range 1102k of the second segment 204k may add up. On account thereof, an offset 1110v of the external face 214m of the first segment 204t in relation to the external face 224m of the second segment 204k may be created.

The tolerance range 1102k of the second segment 204k may then overlap the tolerance range 1110 of the opening 110o, such that an oversize (that is to say an interference fit) is created. Here, the second segment 204k may become wedged with the housing 110 when the sleeve 204 is moved into the opening 1100. Overlapping may be understood to be according to a projection along the insertion direction along which the sleeve 204 is moved, inserted, or plug-fitted into the opening 1100, respectively.

FIG. 11B in an exemplary manner shows in an illustrative manner machining 1100b of the sleeve 204 in that part of the second segment 204k is removed (that is to say detached). On account thereof, the external faces of the first segment 204t and of the second segment 204k may have been or may be mutually aligned.

According to various embodiments, an offset 1110v between the external faces 224m may be removed as is illustrated in FIG. 11B, for example in an analogous manner to the method step shown in an illustrative manner in FIG. 9C. On account thereof, the external faces 214m, 224m may have been or may be mutually aligned 1100c, as is shown in an illustrative manner in FIG. 11C.

Alternatively, the first segment 204t and the second segment 204k may be selected so as to be mutually matching, as has been described above, for example by an analysis of the two segments 204t, 204k. On account thereof, the external faces 214m, 224m may have been or may be mutually aligned 1100c, as is shown in an illustrative manner in FIG. 11C.

The tolerance range 1102t of the first segment 204t and the tolerance range 1102k of the second segment 204k may thus mutually overlap, for example partially or completely, as is illustrated in FIG. 11C. In an illustrative manner, a better fit may be thus achieved without there being the risk of the sleeve 204 jamming in the opening 110o.

In other words, an external diameter of the sleeve 204 on the first segment 204t and an external diameter of the sleeve 204 on the second segment 204k may have been or may be formed in such a manner that the tolerance ranges thereof mutually overlap. For example, the first segment 204t and/or the second segment 204k may be tubular (cf. FIG. 4A) or shell-shaped (cf. FIG. 3A) (that is to say be configured in the form of half-shells, for example).

Figure 12A:
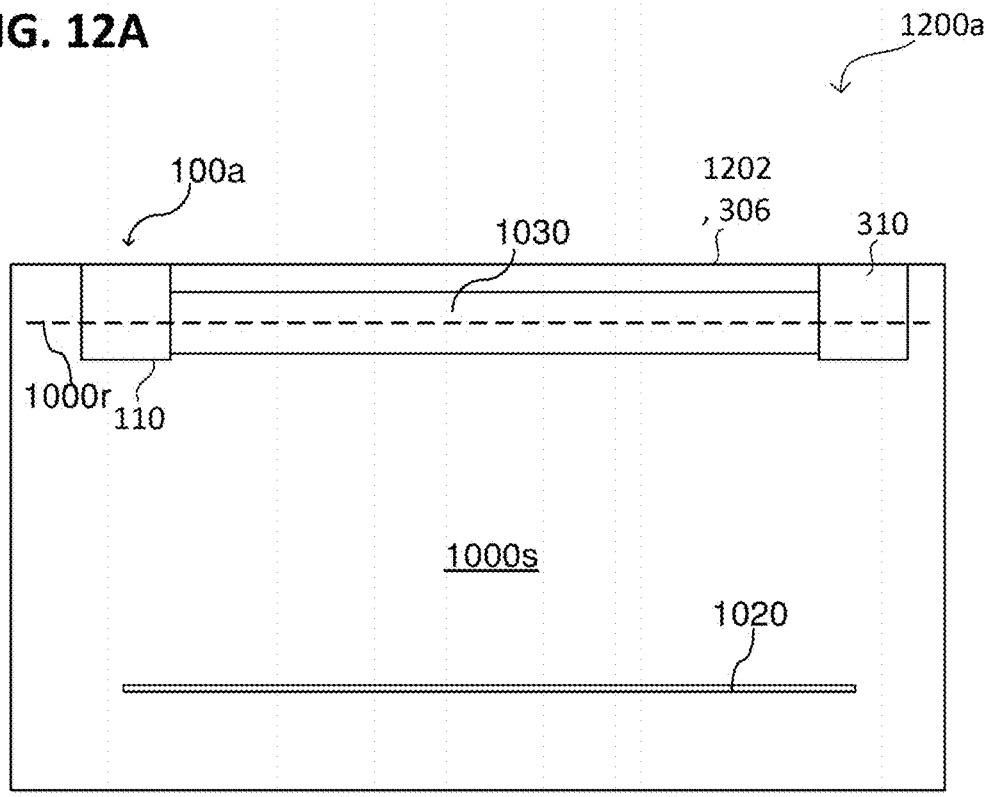
FIGS. 12A and 12B show in each case one processing assembly according to various embodiments, in a schematic side view or cross-sectional view.

FIG. 12A in an illustrative manner shows a processing assembly 1200a (may also be referred to as a vacuum assembly) according to various embodiments, in a side view or a cross-sectional view. The processing assembly 1200a has a vacuum chamber 1202 (may also be referred to as a vacuum processing chamber), having a processing region 1000s for processing (for example coating) a substrate 1020 within the processing region 1000s. The processing assembly 1200a here may have at least one end block assembly 100a (or else the end block assembly 700 or 800) for holding at least one tubular electrode 1030 (for example a cathode tube) within the vacuum processing chamber 1202.

The processing assembly 1200a may be part of a coating system for carrying out a coating process, for example a sputtering process.

The end block assembly 100a may have at least one end block housing 110 in which a shaft (obscured in the view) is rotatably mounted (for example rotatable about an axis 1000r). Furthermore, the tubular electrode 1030 may be coupled to the at least one end block assembly 100a, for example to the shaft of the end block assembly 100a.

Furthermore, the at least one end block assembly 100a may be disposed on and/or in the vacuum chamber 1202. Alternatively, at least the end block assembly 100a may also be fastened to or partially in a chamber cover 306 which covers a chamber opening in a vacuum-tight manner.

According to various embodiments, the end block assembly 100a may be configured as a media end block assembly 100a which is adapted for providing the tubular cathode 1030 with electric output and/or with coolant. Furthermore, the tubular cathode 1030 may have been or may be held, rotatably mounted, and driven on by means of a drive end block 310 at the opposite axial end portion. Alternatively, a drive for rotating the tubular electrode 1030 may have been or may be integrated into the media end block assembly 100a described herein.

It is understood that the vacuum chamber 1202 may be any arbitrary processing chamber which may guarantee operation of the tubular electrode 1030. For example, a magnetron having a cathode tube 1030 (or having two cathode tubes 1030) may have been or may be provided by means of the end block assembly 100a described herein, wherein the cathode tube 1030 may be held and operated in a vacuum processing chamber 1202 by means of a media end block assembly 100a and by means of a drive end block 310.

To this end, a vacuum pump assembly (not illustrated) may have been or may be coupled to the vacuum processing chamber 1202, wherein the vacuum pump assembly has at least one preliminary vacuum pump and at least one high-vacuum pump, for example. Furthermore, the processing assembly 1200a may have a conveying system for conveying the substrate 1020 (or a plurality of substrates 1020) through the vacuum processing chamber 1202. The conveying system here may have one or a plurality of rolls or rollers. The conveying system having a multiplicity of rolls or rollers, for example, may be adapted in such a manner that the substrate 1020 is conveyed along a conveying direction which is directed so as to be substantially perpendicular to the rotation axis 1000r of the at least one cathode tube 1030, or to the shaft. The substrate 1020 in an illustrative manner may thus be processed, for example coated, across the entire substrate width.

Figure 12B:
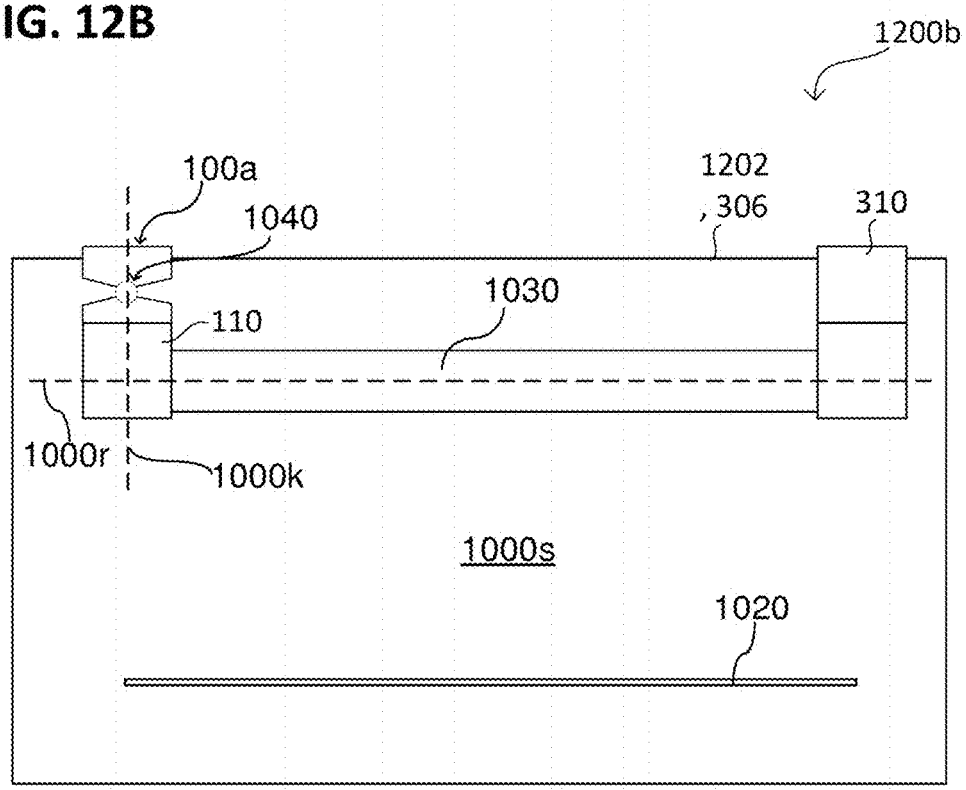

As is shown in an illustrative manner in FIG. 12B the end block housing 110 of the end block assembly 100*a* may have been or may be fastened to the vacuum processing chamber 1020 (or to the chamber cover 306, respectively) by means of an articulated coupling 1040. For example, the articulated coupling 1040 may enable deflection of the end block housing 110 from a standby position by a few degrees, for example deflection by less than 5°. Furthermore, the articulated coupling 1040 may be adapted in such a manner that the former by means of a resilient element may compensate for forces or torques, respectively, which are transmitted from the tubular electrode 1030 to the end block assembly 100*a*, for example on account of untrue running or on account of production tolerances of the tubular electrode 1030, respectively.

According to various embodiments, the articulated coupling 1040 may be adapted as a ball joint (which has one, two, or three degrees of rotary freedom, that is to say freedom of rotation) and/or as a translatory joint (which has one, two, or three degrees of translatory freedom, that is to say freedom of translation). The articulated coupling 1040 may enable rotating or pivoting of the end block assembly 100*a* about an axis 1000*k*, perpendicular to the rotation axis 1000*r* of the tubular electrode 1030, for example. The axis 1000*k* may extend so as to be perpendicular to the wall element to which the end block housing is fitted. Furthermore, the axis 1000*k* may also be directed so as to be perpendicular to the conveying direction.

In an illustrative manner, the articulated coupling 1040 may function as a damper. Furthermore, the service life of the end block assembly 100*a* may be prolonged by means of the articulated coupling 1040, since the end block assembly 100*a* has a rigid rolling bearing or friction bearing 2061 on which forces or torques which are transmitted from the tubular electrode 1030 to the end block assembly 100*a* may act directly. By contrast, the drive end block 310 may have been or may be fixedly fitted to the processing chamber.

By means of the articulated coupling 1040, forces which act on the end block assembly 100*a* may be compensated for (induced in a defined manner), that is to say that forces or torques which are caused, for example, by the weight of the tubular electrode 1030, for example during rotation of the tubular electrode 1030, may be resiliently absorbed. For example, a tubular electrode 1030 which deviates from a rotationally symmetrical shape and/or the rotation axis of which deviates from the main axis of inertia thereof, for example caused by an imbalance or by tolerances in the production of the electrode 1030, may during rotation cause oscillations which are transmitted to the shaft, for example. In an illustrative manner, the articulated coupling 1040 enables a long tubular electrode 1030 to be used and play in the bearing to be reduced.

In other words, the articulated coupling 1040 may be adapted in such a manner that the former by means of a resilient element may compensate for (induce in a defined manner) forces or torques, respectively, that is to say may resiliently absorb forces or torques, respectively, which are transmitted from the tubular electrode 1030 to the end block assembly 100*a*, for example due to untrue running or due to production tolerances of the tubular electrode 1030, respectively.

For example, the tubular electrode 1030 may have a length which substantially corresponds to the spacing of the end block assembly 100*a* from the end block 310, which is larger than approx. 1 m, which is larger than approx. 2 m, for example larger than approx. 2.5 m, for example larger than approx. 3 m, for example larger than approx. 3.5 m, for example approx. 4 m, for example in a range from approx. 2.5 m to approx. 5 m.

FIG. 13 in an illustrative manner shows an end block assembly 1300 according to various embodiments, in a schematic cross-sectional view.

The end block assembly 1300 may have the shaft 202, the bearing 2061, and the second contact structure 208, wherein the shaft 202 is rotatably mounted by means of the bearing 2061 (for example a rolling bearing) and makes electrical contact by means of the second contact structure 208.

The end block assembly 1300 may furthermore have the sleeve 204 which is joined together from the first segment 204*t*, the second segment 204*k*, and at least one further segment 204*v*, 204*r*. The further segment 204*v*, 204*r* may have been or may be provided, for example, in one piece (as the radial segment 204*r*) or in two pieces (as the radial segment 204*r* and the connection segment 204*v*).

The bearing 2061 may have been or may be received in the first segment 204*t* and/or supported by the first segment 204*t*. For example, the bearing 2061 may have been or may be push-fitted into the first segment 204*t*, for example with a precise fit.

The second contact structure 208 may have the brush-type members 208*s* and the current lines 2081, wherein the brush-type members 208*s* bear on the shaft 202 to form a brush-type contact, and the current lines 2081 make electrical contact with the brush-type members 208*s* and electrically connect the latter to the second segment 204*k*.

Furthermore, the end block assembly 1300 may have the housing 110 (end block housing) in which the sleeve 204 is received.

Additionally, the end block assembly 1300 may have a plurality of sealing structures 204*ds* which for sealing a gap between the sleeve 204 and the shaft 202 are disposed between the sleeve 204 and the shaft 202. The gap between the sleeve 204 and the shaft 202, in which the bearing 2061 and the second contact structure 208 are disposed, may thus be sealed, for example in a vacuum-tight and/or water-tight manner, in relation to the environment of the sleeve 204.

One or a plurality of clearances 244*a*, for example in the form of grooves, may be formed in the sleeve 204 for receiving the sealing structures 204*ds*.

One or a plurality of through openings 1302 (for example bores) for intermediate suctioning on the sealing structures 204*ds* may be formed in the sleeve 204, for example in that region in which the sealing structures 204*ds* are or have been disposed. In other words, an intermediate space within the sealing structures 204*ds* may be evacuated or suctioned, respectively, by way of the through openings 1302.

Figure 14:
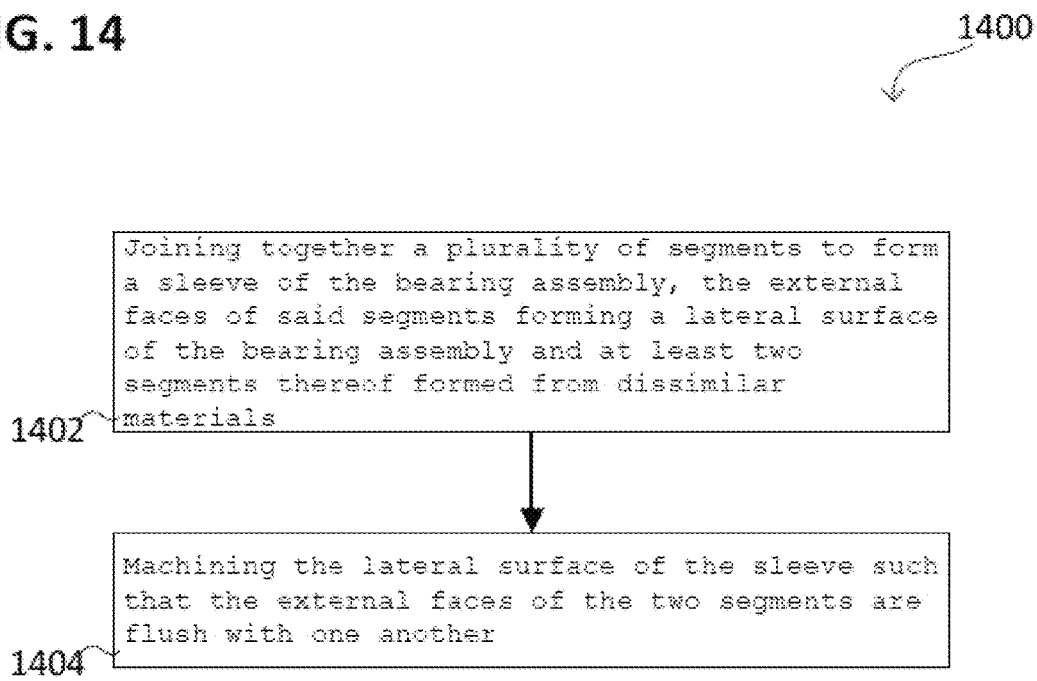
FIG. 14 shows a method for manufacturing a bearing assembly, in a schematic flow diagram.

FIG. 14 in an illustrative manner shows a method 1400 for manufacturing a bearing assembly in a schematic flow diagram.

The method 1400 according to various embodiments in 1402 includes joining a plurality of segments to form a sleeve of the bearing assembly, wherein the external faces of the plurality of segments form a lateral surface of the bearing assembly, and wherein at least two segments of the plurality of segments are formed from dissimilar materials.

Furthermore, the method 1400 in 1402 includes machining of the lateral surface (for example the external side) of the sleeve, such that the external faces of the two segments are flush with one another.

Optionally, the method 1400 includes machining of the internal side of the sleeve, such that the internal sides of the two segments are flush with one another.

Alternatively or additionally, the method 1400 includes machining of the internal side of the sleeve, such that a bearing unit receptacle region (having, for example, a matching clearance, for example in the form of a groove, and/or a fastening structure for fastening the bearing unit) is formed in one segment (for example the support segment) of the plurality of segments, and/or a contact structure receptacle region (having, for example, a matching clearance, for example in the form of a groove, and/or a fastening structure for fastening the contact structure) is formed in another segment (for example the contact segment) of the plurality of segments.

According to various embodiments, a bearing assembly for rotatably mounting an electrode is provided. The bearing assembly enables a construction which enables simple maintenance and/or repair of the bearing assembly or of the wearing parts thereof, for example. In an illustrative manner, the bearing assembly may be replaced in its entirety, such that the bearing assembly may be pre-assembled, significantly shortening the time for maintenance and reducing loss of production. For example, a tubular target for a magnetron may be rotatably mechanically mounted and in electrical contact by means of the bearing assembly.

According to various embodiments, an end block assembly in which the bearing assembly is received is provided. The end block assembly may be assembled in a processing chamber and provide a coolant infeed and an electric power infeed, so as to provide the electrode with coolant and electric power. An end block assembly which apart from mechanical mounting guarantees the supply of power and/or the supply of coolant is also referred to as a media end block.

In an illustrative manner, a power supply (for providing a predefined electrical potential to the tubular electrode, for example), a cooling water supply (for cooling the tubular electrode, for example), and/or a rotatable mounting of the tubular electrode (for example for homogenous atomization of the surface of a tubular magnetron target) may be implemented by means of the bearing assembly (or by means of the end block assembly, respectively).

Low transition resistances are required for electrical contact of the bearing assembly in the end block assembly, this placing particular requirements on the materials used and on the geometric shape of the electrical contacts. In an illustrative manner, electrical contacts which enable a contact area that is as large as possible to the electric power infeed in the end block assembly and which have low electrical resistance are required. The contacts are thus mostly made from a particularly conductive material and fastened in a contact region (externally, for example) on the bearing assembly. The contacts (also referred to as contact segments) may lead to an offset in the external face of the bearing assembly.

On account of production tolerances, variations in the external diameter of the bearing assembly arise on the contacts, creating a mutual overlap forming an offset (that is to say a step) in the external surface of the bearing assembly and potentially leading to canting of the bearing assembly in the end block. This may lead to the bearing assembly jamming when being inserted into the end block assembly as well as when being extracted from the end block assembly. If the canted bearing assembly cannot be loosened again, extraction of the bearing assembly becomes impossible, and the end block assembly is rendered useless.

Furthermore, the variations in the external diameter of the bearing assembly influence the contact area by way of which the bearing assembly makes contact with the electric power infeed in the end block assembly. In an illustrative manner, the end block assembly does not make contact with or incompletely makes contact with the bearing assembly when the internal diameter (of the electric power infeed) of the end block assembly on the electrical contacts is too large and/or the external diameter of the bearing assembly is too small (that is to say when they are not mutually matching).

According to various embodiments, a bearing assembly which enables simple and precisely fitting assembly or disassembly in the end block assembly, respectively, is provided.

According to various embodiments, a bearing assembly which enables reliable contact with the end block assembly is provided.

According to various embodiments, the manufacturing costs and machining costs for the bearing assembly are reduced, since semi-finished products (pre-fabricated products) may be resorted to.

According to various embodiments, an end block assembly for rotatably mounting a tubular electrode in a processing chamber may have the following: a receptacle region for receiving a bearing assembly which has a coupling region for coupling the tubular electrode thereto, and the bearing assembly of which the coupling region is supported by a sleeve of the bearing assembly (also referred to as the housing of the bearing assembly). The sleeve (for example a tubular support) is plug-fitted into the receptacle region. The sleeve is joined together from a plurality of segments (for example tubular segments), the external faces thereof forming a lateral surface of the bearing assembly and at least two segments thereof being formed from dissimilar materials. The external faces of the two segments are mutually aligned such that they are flush with one another.

In an illustrative manner, the components of the bearing assembly that serve for rotatable mounting and electrical contact with the electrode are received in the sleeve. In an illustrative manner, the sleeve forms the housing of the bearing assembly, which is made so as to match the receptacle region of the end block assembly, such that the bearing assembly fits into the receptacle region of the end block assembly.

In an illustrative manner, one of the two segments (also referred to as a contact segment) serves for making contact with the sleeve, and the other of the two segments (also referred to as the support segment) in an illustrative manner serves for reinforcing and stabilizing the sleeve.

In other words, the sleeve according to various embodiments is provided in such a manner that an offset in the lateral surface that is created when the sleeve is joined together is or has been equalized.

According to various embodiments, the two segments may be interconnected in a materially integral manner (for example, adhesively bonded, welded or soldered). Alternatively or additionally, the two segments may be interconnected in a form-fitting manner (for example by screwing).

According to various embodiments, the end block assembly may furthermore have a housing which has an opening, wherein the opening forms the receptacle region.

In order for the sleeve to be able to be inserted into the end block assembly in a reliable manner, the opening and the sleeve are made so as to have slight mutual play, that is to say having a loose fit. The less play there is for the sleeve in the end block assembly, the more precise the mounting of the sleeve in the end block assembly, on account of which mechanical stresses are able to be better distributed and undesirable relative movement of the sleeve in the end block assembly may be avoided. The less play there is for the sleeve in the end block assembly, the higher the requirements set for the production tolerances used for making the sleeve (that is to say that the production tolerances should be as small as possible).

According to various embodiments, mutual aligning of the external faces of the two segments is performed such that the production tolerances of the former mutually overlap, for example completely or partially.

According to various embodiments, the end block assembly may further have a bearing unit which is plug-fitted into the sleeve and which has a bearing and a shaft which is rotatably mounted by means of the bearing. The rotatably mounted shaft has the coupling region.

According to various embodiments, one segment of the plurality of segments (for example one of the two segments or another segment) of the sleeve may have a fastening structure for releasably fastening the sleeve to the housing.

According to various embodiments, the two segments may form a rotary member. The external faces of the two segments run parallel with the rotation axis of the rotary member. In other words, the sleeve on the two segments may be cylindrical, for example having a through opening along the axis of the cylinder (corresponding to the rotation axis). The external face of the cylinder forms the lateral surface of the sleeve, i.e., a lateral surface may refer to all sides of an object excluding the base and the top of the object.

According to various embodiments, one segment of the two segments (the support segment) may have a first material or may be formed therefrom, and the other segment of the two segments (the contact segment) may have a second material or may be formed therefrom.

According to various embodiments, a fracture toughness of the first material may be greater than a fracture toughness of the second material. Alternatively or additionally, an electrical conductivity of the second material may be greater than an electrical conductivity of the first material. The fracture toughness and the electrical conductivity may relate to a temperature, for example to room temperature. The electrical conductivity may be stated for DC.

The first material may have a fracture toughness (also referred to as rupture toughness) that is as great as possible, that is to say, in an illustrative manner, be particularly stable. Fracture toughness describes the resistance of a material to crack propagation (crack expansion). The higher the fracture toughness of a material, the more capable of stress the material may be prior to failure.

For example, a ratio of the fracture toughness of the first material to the fracture toughness of the second material may be larger than approx. 100%, for example larger than approx. 150%, for example larger than approx. 200%, for example larger than approx. 300%, for example larger than approx. 400%, for example in a range from approx. 150% to approx. 500%.

The fracture toughness of the first material may be larger than for example approx. 15 MPa·m$^{0.5}$, for example larger than approx. 20 MPa·m$^{0.5}$, for example larger than approx. 25 MPa·m$^{0.5}$, for example larger than approx. 30 MPa·m$^{0.5}$, for example larger than approx. 35 MPa·m$^{0.5}$, for example larger than approx. 40 MPa·m$^{0.5}$, for example larger than approx. 45 MPa·m$^{0.5}$, for example larger than approx. 50 MPa·m$^{0.5}$, for example larger than approx. 55 MPa·m$^{0.5}$, for example larger than approx. 60 MPa·m$^{0.5}$. The fracture toughness may be in a range, for example, from approx. 35 MPa·m$^{0.5}$ to approx. 65 MPa·m$^{0.5}$, for example in a range from approx. 45 MPa·m$^{0.5}$ to approx. 60 MPa·m$^{0.5}$.

For example, a ratio of the electrical conductivity of the second material to the electrical conductivity of the first material may be larger than approx. 100%, for example larger than approx. 150%, for example larger than approx. 200%, for example larger than approx. 300%, for example larger than approx. 400%, for example larger than approx. 500%, for example larger than approx. 600%, for example in a range from approx. 150% to approx. 700%.

The second material may have an electrical conductivity (at room temperature) of more than approx. $10^6$ $\Omega^{-1}\cdot m^{-1}$, for example of more than approx. $2\cdot10^6$ $\Omega^{-1}\cdot m^{-1}$, for example of more than approx. $10\cdot10^6$ $\Omega^{-1}\cdot m^{-1}$, for example of more than approx. $20\cdot10^6$ $\Omega^{-1}\cdot m^{-1}$, for example of more than approx. $50\cdot10^6$ $\Omega^{-1}\cdot m^{-1}$.

For example, the first material (the material of the support segment) may have iron or an alloy having iron, for example steel, or be formed therefrom.

For example, the second material (the material of the contact segment) may have copper or be formed therefrom.

An end block assembly may furthermore have a first electrical contact structure for providing the bearing assembly with electric power in the case of a sleeve being plug-fitted into the receptacle region, for example. The first contact structure may be in electrical contact with the contact segment in the case of a sleeve being plug-fitted into the receptacle region, for example.

According to various embodiments, the bearing assembly may have a second electrical contact structure which is disposed in the sleeve and makes electrical contact with the shaft. The second contact structure may have one or a plurality of brush members (for example carbon brushes) which slide on a lateral surface of the shaft when the latter is rotated and thus make brush-type contact with the shaft.

According to various embodiments, by means of the second contact structure (for example by means of sliding electrical contacts), the electric power required for processing may be transmitted via the shaft to a tubular electrode which is coupled to the shaft.

According to various embodiments, the first contact structure and the second contact structure may be adapted in such a manner that, in the case of the bearing unit being plug-fitted into the sleeve, for example, the former form an electrically conducting connection. The electric power here may be transmitted from the first contact structure to the contact segment of the sleeve and from the contact segment to the second contact structure which feeds the electric power to the shaft.

According to various embodiments, an end block assembly may furthermore have a coolant infeed for providing the bearing assembly with coolant.

According to various embodiments, a processing assembly may have the following: a processing chamber having a processing region, at least one end block assembly as has been described above, fastened to and/or in the processing chamber, and at least one tubular electrode coupled to the at least one end block assembly, for processing a substrate in the processing region.

According to various embodiments, a bearing assembly for rotatably mounting a tubular electrode may have the following: a coupling region for coupling the tubular electrode thereto; a sleeve supporting the coupling region (for supporting the coupling region). The sleeve is joined together from a plurality of segments, the external faces thereof forming a lateral surface (e.g. the external side) of the bearing assembly and at least two segments thereof being formed from dissimilar materials. The external faces of the two segments are mutually aligned such that they are flush with one another.

According to various embodiments, a method for manufacturing a bearing assembly for rotatably mounting a tubular electrode may include the following method: joining together a plurality of segments to form a sleeve of the bearing assembly, the external faces of said segments forming a lateral surface of the bearing assembly and at least two segments thereof being formed from dissimilar materials; machining the lateral surface (e.g. the external side) of the sleeve such that the external faces of the two segments are flush with one another.

According to various embodiments, joining together of at least the two segments may be performed by a welding procedure.

According to various embodiments, the method may furthermore include plug-fitting into the sleeve a bearing unit (that is to say a radial or an axial bearing) which has a bearing (a rolling bearing or a friction bearing, for example) and a shaft which by means of the bearing is rotatably mounted (for example rotatable about a rotary axis or a rotation axis). The rotatably mounted shaft has the coupling region for coupling the tubular electrode thereto. The shaft may be elongate in the direction of the rotation axis (that is to say the axial direction) thereof.

According to various embodiments, an end block assembly for rotatably mounting a tubular electrode in a processing chamber may have the following: a tubular sleeve having a first segment for receiving a bearing unit in the first segment. The second segment has a first material; a second segment for making contact with the sleeve. The second segment is connected to the first segment and has a second material.

The first segment may be adapted for receiving a bearing unit and to this end may have a bearing unit receptacle region (having, for example, a matching clearance and/or a fastening structure for fastening the bearing unit). The second segment may be adapted for receiving a contact structure and to this end have a contact structure receptacle region (having, for example, a matching clearance and/or a fastening structure for fastening the contact structure).

According to various embodiments, an end block assembly for rotatably mounting a tubular electrode in a processing chamber may have the following: a housing which has an opening for receiving a sleeve, and the sleeve plug-fitted into the opening. A first segment of the sleeve is formed from a first material for receiving a bearing unit, and a second segment of the sleeve is formed from a second material for making electrical contact with the sleeve.

According to various embodiments, the first segment may have an external diameter which deviates by less than 0.1 mm from an external diameter of the second segment. Making electrical contact may be facilitated thereby.

According to various embodiments, the two segments (also referred to as sleeve segments) when joined together may have been or may be machined in such a manner that lateral surface regions of the sleeve that are formed by the two segments are flush with one another, such that the sleeve fits into the opening.

In the context of this application two surfaces (for example the external faces) being flush with one another can be understood as meaning that an offset between the two surfaces (measured perpendicular to the surfaces) is smaller than approx. 0.1 mm, for example smaller than approx. 0.05 mm, for example smaller than approx. 0.01 mm, for example smaller than approx. 0.005 mm, for example smaller than approx. 0.002 mm, for example smaller than approx. 0.001 mm, for example smaller than approx. 0.5 µm, for example smaller than approx. 0.2 µm. In an illustrative manner, the two surfaces may run so as to be substantially mutually parallel and/or be in mutual continuation (for example so as to be substantially free from any offset). In an illustrative manner, the center axes of the lateral surfaces of the two segments (for example of two cylindrical segments) may for example be congruent, that is to say be identical.

On account of the production process (for example by way of machining) the two segments or the external faces thereof, respectively, may have a surface roughness which is defined by the production process. The offset between the mutually flush external faces of the two segments according to various embodiments may be smaller than the surface roughness of the two segments, for example smaller than 0.5 µm, for example smaller than 0.2 µm. In an illustrative manner, the external faces of the two segments may form a common surface (for example a lateral surface).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An end block assembly for rotatably mounting a tubular electrode in a processing chamber, the end block assembly comprising:
   a receptacle region for receiving a bearing assembly which has a coupling region for coupling the tubular electrode;
   the bearing assembly of which the coupling region is supported by a sleeve of the bearing assembly, wherein the sleeve is slide-fitted into the receptacle region;
   wherein the sleeve is joined together from a plurality of segments, the external faces of the plurality of segments forming a lateral surface of the bearing assembly and at least two segments of the plurality of segments being formed from dissimilar materials;
   wherein the external faces of the at least two segments are mutually aligned such that the external faces are flush with one another.

2. The end block assembly of claim 1,
   wherein the at least two segments are interconnected in a materially integral manner.

3. The end block assembly of claim 1, further comprising:
   a housing which has an opening;
   wherein the opening forms the receptacle region.

4. The end block assembly of claim 1, further comprising:
   a bearing unit which is plug-fitted into the sleeve and which has a bearing and
   a shaft which is rotatably mounted by means of the bearing;
   wherein the rotatably mounted shaft has the coupling region.

5. The end block assembly of claim 3,
   wherein one segment of the plurality of segments of the sleeve has a fastening structure for releasably fastening the sleeve to the housing.

6. The end block assembly of claim 1, further comprising:
   wherein the at least two segments form a rotary member; and wherein the external faces of the at least two segments run parallel with the rotation axis of the rotary member.

7. The end block assembly of claim 1,
wherein one segment of the at least two segments is formed from a first material, and the other segment of the at least two segments is formed from a second material; and
wherein a fracture toughness of the first material is greater than a fracture toughness of the second material.

8. The end block assembly of claim 1,
wherein one segment of the at least two segments is formed from a first material, and the other segment of the at least two segments is formed from a second material; and
wherein an electrical conductivity of the second material is greater than an electrical conductivity of the first material.

9. The end block assembly of claim 4, further comprising:
a first electrical contact structure for providing the bearing assembly with electric power to the sleeve slide-fitted into the receptacle region; wherein the bearing assembly has a second electrical contact structure which is disposed in the sleeve and makes electrical contact with the shaft;
wherein the bearing unit is plug-fitted into the sleeve, such that the first electrical contact structure and the second electrical contact structure form an electrically conducting connection.

10. The end block assembly of claim 1, further comprising:
a coolant infeed for providing the bearing assembly with coolant.

11. A processing assembly, comprising:
a processing chamber comprising a processing region;
at least one end block assembly, comprising:
a receptacle region for receiving a bearing assembly which has a coupling region for coupling the tubular electrode;
the bearing assembly of which the coupling region is supported by a sleeve of the bearing assembly, wherein the sleeve is slide-fitted into the receptacle region;
wherein the sleeve is joined together from a plurality of segments, the external faces of the plurality of segments forming a lateral surface of the bearing assembly and at least two segments of the plurality of segments being formed from dissimilar materials;
wherein the external faces of the at least two segments are mutually aligned such that the external faces are flush with one another;
wherein the at least one end block assembly is at least one of fastened to or in the processing chamber; and
at least one tubular electrode coupled to the at least one end block assembly, for processing a substrate in the processing region.

12. The end block assembly of claim 1,
wherein the external faces of the at least two segments are mutually aligned such that they are flush with one another over their entire perimeter.

13. The end block assembly of claim 1,
wherein the external faces of the at least two segments are mutually aligned such that they are flush with one another having an offset between the two external faces less than 0.1 mm.

14. The end block assembly of claim 1,
wherein the at least two segments are attached together by adhesive, soldering, brazing or welding.

15. The end block assembly of claim 1,
wherein one segment of the at least two segments is formed from a first material, and another segment of the at least two segments is formed from a second material; and
wherein a fracture toughness of the first material is greater than a fracture toughness of the second material; and
wherein an electrical conductivity of the second material is greater than an electrical conductivity of the first material.

* * * * *